(12) United States Patent
Kazama et al.

(10) Patent No.: US 7,950,927 B2
(45) Date of Patent: May 31, 2011

(54) CONDUCTIVE CONTACT HOLDER AND CONDUCTIVE CONTACT UNIT

(75) Inventors: Toshio Kazama, Nagano (JP); Tomohiro Kawarabayashi, Nagano (JP); Shigeki Ishikawa, Nagano (JP); Shinya Miyaji, Tokyo (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/448,221

(22) PCT Filed: Dec. 13, 2007

(86) PCT No.: PCT/JP2007/074042
§ 371 (c)(1),
(2), (4) Date: Dec. 4, 2009

(87) PCT Pub. No.: WO2008/072699
PCT Pub. Date: Jun. 19, 2008

(65) Prior Publication Data
US 2010/0087075 A1    Apr. 8, 2010

(30) Foreign Application Priority Data
Dec. 15, 2006    (JP) .................. 2006-339148

(51) Int. Cl.
*H01R 12/00* (2006.01)
(52) U.S. Cl. ..................... 439/66; 324/755.05
(58) Field of Classification Search ............ 439/66; 324/755.05
See application file for complete search history.

(56) References Cited

U.S. PATENT DOCUMENTS

| | | | | |
|---|---|---|---|---|
| 4,792,646 A * | 12/1988 | Enomoto | .............. | 174/266 |
| 4,806,111 A * | 2/1989 | Nishi et al. | ............ | 439/109 |
| 4,961,709 A * | 10/1990 | Noschese | .............. | 439/66 |
| 4,964,948 A * | 10/1990 | Reed | .................. | 216/18 |
| 5,037,332 A * | 8/1991 | Wilson | ............. | 439/607.03 |
| 5,178,549 A * | 1/1993 | Neumann et al. | ....... | 439/74 |
| 5,211,567 A * | 5/1993 | Neumann et al. | ....... | 439/74 |
| 6,642,728 B1 * | 11/2003 | Kudo et al. | ........... | 324/755.02 |
| 6,953,348 B2 * | 10/2005 | Yanagisawa et al. | ..... | 439/66 |
| 7,102,373 B2 * | 9/2006 | Yoshida | ............. | 324/756.03 |
| 7,126,362 B2 * | 10/2006 | Yoshida et al. | ...... | 324/756.03 |
| 7,239,158 B2 * | 7/2007 | Kazama et al. | ...... | 324/756.03 |
| 7,282,378 B2 * | 10/2007 | Yoshida | .............. | 438/18 |

(Continued)

FOREIGN PATENT DOCUMENTS

JP    3500105    8/2001

(Continued)

OTHER PUBLICATIONS

International Search Report dated Jan. 15, 2008, issued on PCT/JP2007/074042.

(Continued)

*Primary Examiner* — Ross N Gushi
(74) *Attorney, Agent, or Firm* — Edwards Angell Palmer & Dodge LLP

(57) ABSTRACT

A conductive contact holder includes a holder substrate and a holding member. The holder substrate is made of a conductive material and has an opening for holding a conductive contact for inputting and outputting a signal to and from a circuit structure. The holding member is formed by filling the opening with an insulating material, smoothing the surface of the insulating material, and forming a hole through the insulating material for inserting the conductive contact.

5 Claims, 17 Drawing Sheets

U.S. PATENT DOCUMENTS

| | | | | |
|---|---|---|---|---|
| 7,420,383 B2* | 9/2008 | Yoshida | | 324/756.07 |
| 7,456,645 B2* | 11/2008 | Yoshida et al. | | 324/755.02 |
| 7,463,041 B2* | 12/2008 | Kazama | | 324/755.05 |
| 7,470,149 B2* | 12/2008 | Kazama et al. | | 439/607.05 |
| 7,656,175 B2* | 2/2010 | Fukushima et al. | | 324/750.2 |
| 7,716,825 B2* | 5/2010 | Murakami | | 29/846 |
| 7,785,147 B2* | 8/2010 | Nakayama et al. | | 439/607.05 |
| 7,832,091 B2* | 11/2010 | Kazama et al. | | 29/829 |
| 7,845,955 B2* | 12/2010 | Nakayama et al. | | 439/66 |
| 2003/0006787 A1* | 1/2003 | Kazama | | 324/754 |
| 2003/0137316 A1* | 7/2003 | Kazama | | 324/761 |
| 2004/0043641 A1* | 3/2004 | Kosmala | | 439/66 |
| 2004/0061513 A1* | 4/2004 | Sweet et al. | | 324/754 |
| 2004/0212381 A1* | 10/2004 | Yoshida et al. | | 324/754 |
| 2005/0225313 A1* | 10/2005 | Kazama et al. | | 324/158.1 |
| 2005/0237070 A1* | 10/2005 | Kazama | | 324/754 |
| 2005/0258843 A1* | 11/2005 | Kazama | | 324/754 |
| 2005/0266734 A1* | 12/2005 | Kazama | | 439/700 |
| 2006/0066330 A1* | 3/2006 | Yoshida | | 324/754 |
| 2006/0066331 A1* | 3/2006 | Yoshida et al. | | 324/754 |
| 2006/0094134 A1* | 5/2006 | Yoshida | | 438/14 |
| 2007/0111560 A1* | 5/2007 | Kazama et al. | | 439/71 |
| 2007/0145990 A1* | 6/2007 | Fukushima et al. | | 324/754 |
| 2009/0009205 A1* | 1/2009 | Kazama | | 324/761 |
| 2009/0093161 A1* | 4/2009 | Kazama et al. | | 439/620.01 |
| 2009/0151157 A1* | 6/2009 | Kazama et al. | | 29/829 |
| 2009/0183908 A1* | 7/2009 | Kazama et al. | | 174/262 |
| 2010/0087075 A1* | 4/2010 | Kazama et al. | | 439/85 |

FOREIGN PATENT DOCUMENTS

| | | |
|---|---|---|
| JP | 2004-259648 | 9/2004 |
| KR | 10-0791136 | 12/2004 |
| WO | WO-03/087852 | 10/2003 |

OTHER PUBLICATIONS

Supplementary European Search Report dated Aug. 20, 2010, and issed on corresponding European Patent Application No. 07850562.5.

Korean Office Action for Korean Patent Application No. 10-2009-7014639 dated Jan. 5, 2011.

* cited by examiner

CONDUCTIVE CONTACT HOLDER AND CONDUCTIVE CONTACT UNIT

TECHNICAL FIELD

The present invention relates to a conductive contact holder that holds a conductive contact for input and output of a signal in an electrical characteristic inspection of a semiconductor integrated circuit and the like, a conductive contact unit including the conductive contact holder, and a method of manufacturing the conductive contact holder.

BACKGROUND ART

In an electrical characteristic inspection of a semiconductor integrated circuit, such as one in an integrated circuit (IC) chip, a conductive contact unit is used to hold a plurality of conductive contacts at predetermined positions that correspond to a pattern of electrodes for external connections on the semiconductor integrated circuit. Such a conductive contact unit includes a conductive contact holder including a substrate made of a conductive material and holes for inserting the conductive contacts.

To implement high-speed processing, a recent semiconductor integrated circuit operates with a high frequency electrical signal (a high frequency signal) at a frequency of about several hundred mega hertz (MHz) to several hundred giga-hertz (GHz). To form a conductive contact unit that can support such a high frequency signal, it is preferable to make the external diameter of the conductive contact as small as possible. As a technology for supporting a high frequency signal, a conductive contact holder is known that includes a metal holder substrate having openings in which insulating members, each having a hollow, are embedded. The conductive contacts are inserted in the hollows to be held therein (for example, see Patent Documents 1 to 3).

Such a conductive contact holder is manufactured by inserting the insulating member having a hollow created in advance through hole machining into the holder substrate, or after embedding the insulating member into the opening of the holder substrate, a hollow is formed in the insulating member through hole machining.

[Patent Document 1] Japanese Patent Application Laid-open No. 2004-259648
[Patent Document 2] Japanese Patent No. 3500105
[Patent Document 3] International Publication No. 03/087852

DISCLOSURE OF INVENTION

Problem to be Solved by the Invention

Recent semiconductor integrated circuits have become highly integrated and downsized. To manufacture a conductive contact unit that can support highly integrated and downsized semiconductor circuit, the conductive contacts needs to be narrowly spaced.

However, with the conventional technologies, it is difficult to mount narrowly spaced insulating members on the holder substrate when a conductive contact holder is manufactured. More specifically, it is difficult to apply the hole machining when the conductive contacts are narrowly spaced. In addition, it becomes difficult to assemble the insulating members in the openings on the holder substrate with high accuracy. Moreover, upon assembling the insulating members subjected to the hole machining in advance on the holder substrate, the insulating members may deform in the assembling process because the insulating members have been weakened due to the hole machining. Furthermore, when the insulating members are adhered to the holder substrate with an adhesive, application of the adhesive is also difficult.

The present invention has been made to solve the above problems in the conventional technology and it is an object of the present invention to provide an easily manufactured conductive contact holder and a conductive contact unit capable of supporting a high frequency signal and a highly integrated and downsized inspection object and a method of manufacturing the conductive contact holder.

Means for Solving Problem

According to an aspect of the present invention, a conductive contact holder holds a conductive contact for inputting and outputting a signal to and from a circuit structure. The conductive contact holder includes a holder substrate that is made of a conductive material and includes an opening that holds the conductive contact, and a holding member that is formed by filling the opening with an insulating material, smoothing a surface of the insulating material, and forming a hole through the insulating material for inserting the conductive contact.

In the conductive contact holder, the holding member includes a disengagement preventer that prevents the holding member from being disengaged in a direction of a normal line of at least one of surfaces of the holder substrate.

In the conductive contact holder, the holding member includes a rotation preventer that prevents the insulating material from rotating around an axis perpendicular to a surface of the holder substrate.

In the conductive contact holder, the holding member includes a coat made of the insulating material in a form of a film when the opening is filled with the insulating material, the coat covering partly or entirely at least one of surfaces of the holder substrate.

In the conductive contact holder, the holding member includes a disengagement preventer that prevents the holding member from being disengaged in a direction of a normal line of a surface of the holder substrate, to which the coat is applied.

In the conductive contact holder, the insulating material is fluorine resin.

In the conductive contact holder, the holder substrate includes a plurality of substrates stacked in a thickness direction thereof.

According to an aspect of the present invention, a conductive contact unit includes the conductive contact holder, a plurality of conductive contacts that are held in the conductive contact holder, and a circuit board that is electrically connected to the conductive contacts and includes a circuit for generating a signal to be input to the circuit structure.

According to an aspect of the present invention, a method of manufacturing a conductive contact holder including a conductive holder substrate in which an opening is formed to hold a conductive contact for inputting and outputting a signal to and from a circuit structure. The method includes filling the opening with an insulating material, smoothing a surface of the insulating material filled in the opening at the filling, and forming a hole for inserting the conductive contact in the insulating material with the surface smoothed at the smoothing.

In the method of manufacturing a conductive contact holder, the filling includes covering at least one of surfaces of the holder substrate partly or entirely with the insulating material in a form of a film when the opening is filled with the insulating material.

Effect of the Invention

According to an aspect of the present invention, a holding member is formed by filling an opening on a holder substrate with an insulating material, machining at least a surface of the insulating material, and forming a hole for inserting the conductive contact therethrough. Therefore, a holding member that can hold the conductive contacts, each having a small diameter and narrowly spaced, can be easily assembled on the holder substrate. Thus, it is possible to provide an easily manufactured conductive contact holder and a conductive contact unit capable of supporting a high frequency signal and a highly integrated and downsized inspection object.

Figure 1:
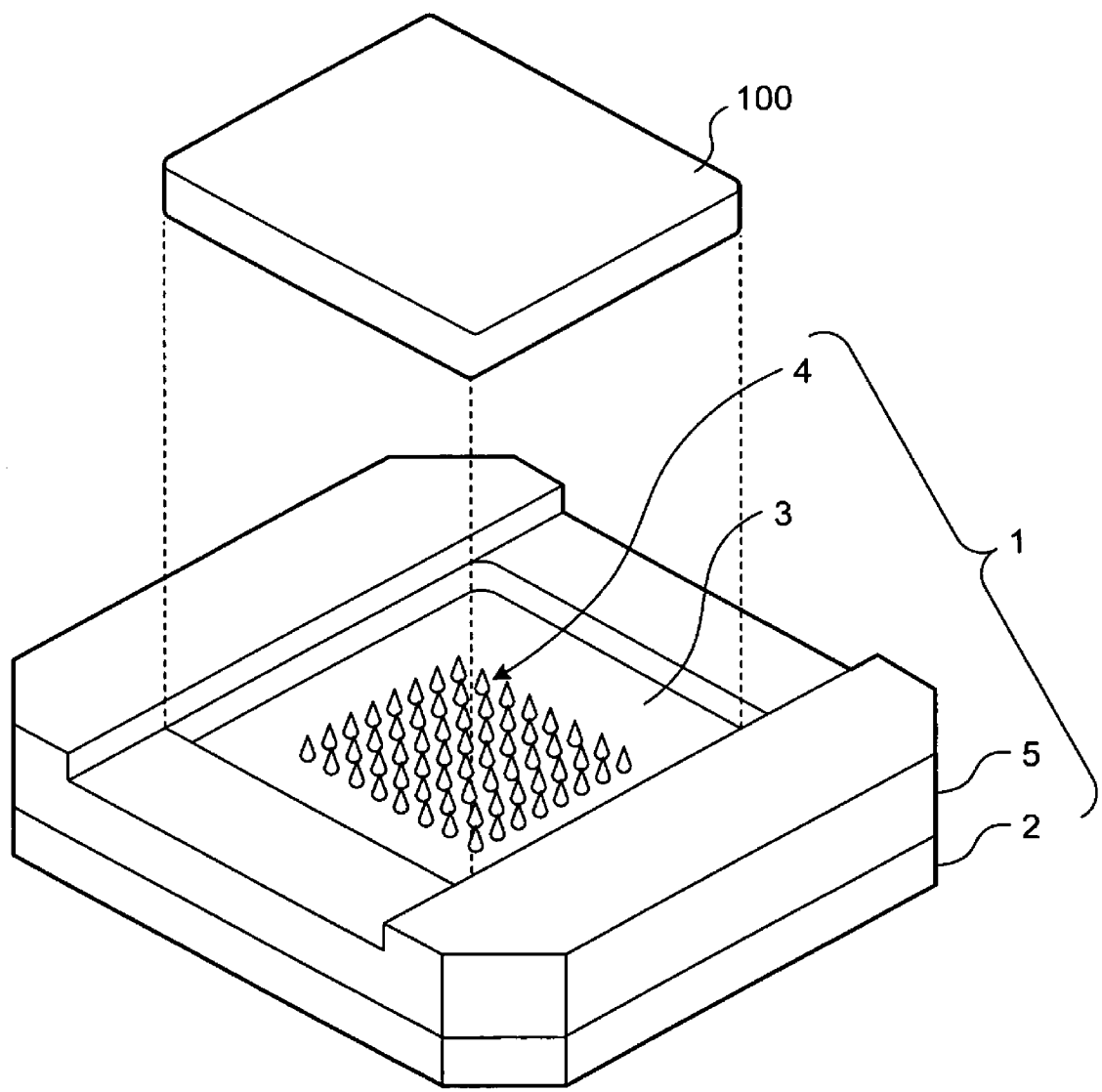
FIG. 1 is a perspective view of a structure of a conductive contact unit according to a first embodiment of the present invention.

EXPLANATIONS OF LETTERS OR NUMERALS 1 conductive contact unit
2 circuit board
2a signaling electrode
2b power-supplying electrode
2G grounding electrode
3, 6 conductive contact holder
4 conductive contact
4a signaling conductive contact
4b grounding conductive contact
4c power-supplying conductive contact
5 holder member
31 holder substrate
32, 33 holding member
34, 61, 63, 65, 68, 70, 81, 83, 84, 85, 91, 93 first substrate
35 second substrate
36, 38, 67, 82, 92, 94 first holding member
36a, 37a, 38a, 39a, 411, 421, 441, 451 flange
36b, 37b, 38b, 39b, 82b, 92b, 94a cylinder
37, 39 second holding member
41, 42, 44, 45, 47, 48 needle-shaped member
43, 46, 49 spring member
62, 64, 66, 69, 71, 341, 343, 811, 831, 841, 851, 911, 931 fourth opening
62a, 62b, 69c, 341a, 342b, 343a, 351a, 352b, 353a large-diameter portion
62c, 64c, 69a, 69b, 341b, 342a, 343b, 351b, 352a, 353b, 811b, 911b small-diameter portion
64a, 64b, 82a, 92a, 811a, 911a tapered portion
66a thread
82c, 92c, 94b, 94c coat
100 semiconductor integrated circuit
101 connecting electrodes
200 workstation
311 first opening
312 second opening
313 third opening
342 fifth opening
351, 353 sixth opening
352 seventh opening
361, 371, 381, 391, 671, 821, 921, 941 hole
361a, 371a, 381a, 391a, 671b, 821b, 921b, 941b small-diameter hole 361b, 371b, 381b, 391b, 671a, 821a, 921a, 941a large-diameter hole
812, 832, 842, 852 recess

BEST MODE(S) FOR CARRYING OUT THE INVENTION

Best modes for carrying out the present invention (hereinafter, "embodiments") will be described with reference to the accompanying drawings. It should be noted that the drawings are schematics in which the relationship between the thickness and width of each element, or a ratio of thicknesses of elements may be different from the actual ones. Obviously, a relationship or a ratio of dimensions may be illustrated differently among the drawings.

First Embodiment

FIG. 1 is a perspective view of a structure of a conductive contact unit according to a first embodiment of the present invention. A conductive contact unit 1, as illustrated in FIG. 1, includes a circuit board 2 provided with a circuit that performs processes such as generation of a signal to be supplied to a semiconductor integrated circuit 100 having a circuit structure to be inspected, a conductive contact holder 3 arranged on the circuit board 2 and having predetermined openings (not illustrated in FIG. 1), and conductive contacts 4 held in the openings provided on the conductive contact holder 3. Moreover, a holder member 5, provided to prevent the semiconductor integrated circuit 100 from being out of alignment during usage, is arranged on the circuit board 2 and around the outer circumference of the conductive contact holder 3.

The circuit board 2 includes an inspection circuit for inspecting electrical characteristics of the semiconductor integrated circuit 100. The circuit board 2 also includes electrodes (not illustrated in FIG. 1), arranged on the surface thereof that is brought in contact with the conductive contact holder 3 for electrically connecting an internal circuit included therein to the conductive contacts 4.

The conductive contacts 4 electrically connect the internal circuit included in the circuit board 2 to the semiconductor integrated circuit 100. The conductive contacts 4 are classified into three types depending on types of signals supplied to the semiconductor integrated circuit 100. More specifically, the conductive contacts 4 are generally classified into a signaling conductive contact 4a that is responsible for input and output of electrical signals with respect to the semiconductor integrated circuit 100, a grounding conductive contact 4b that supplies a ground potential to the semiconductor integrated circuit 100, and a power-supplying conductive contact 4c that supplies driving power to the semiconductor integrated circuit 100. In the first embodiment, the signaling conductive contact 4a, the grounding conductive contact 4b, and the power-supplying conductive contact 4c are collectively referred to as "conductive contacts 4". When a reference is made individually, each of these terms will be used, respectively.

Figure 2:
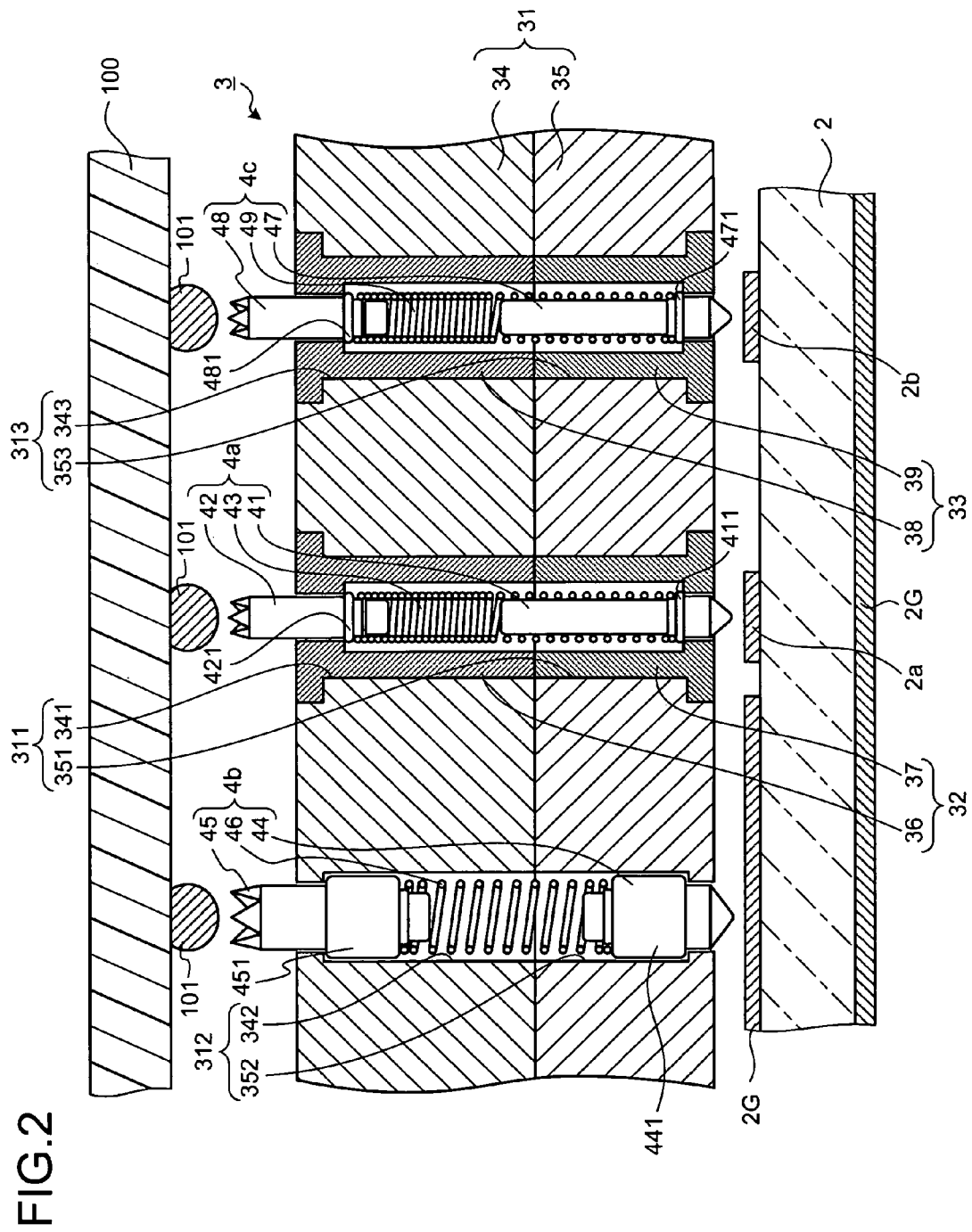
FIG. 2 is a diagram of detailed structures of a conductive contact holder and conductive contacts according to the first embodiment.
Figure 3:
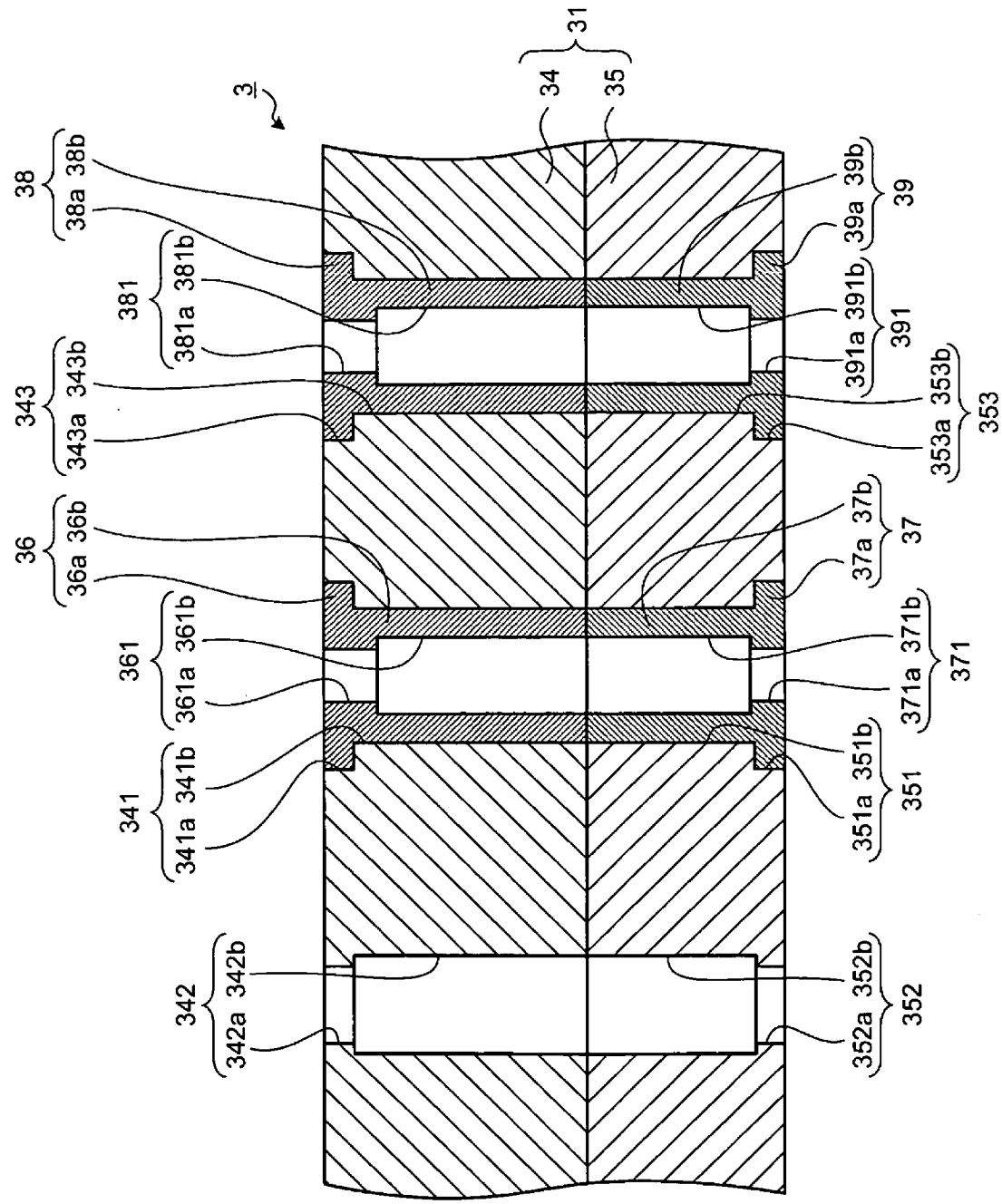
FIG. 3 is a diagram of a detailed structure of the conductive contact holder according to the first embodiment.
Figure 4:
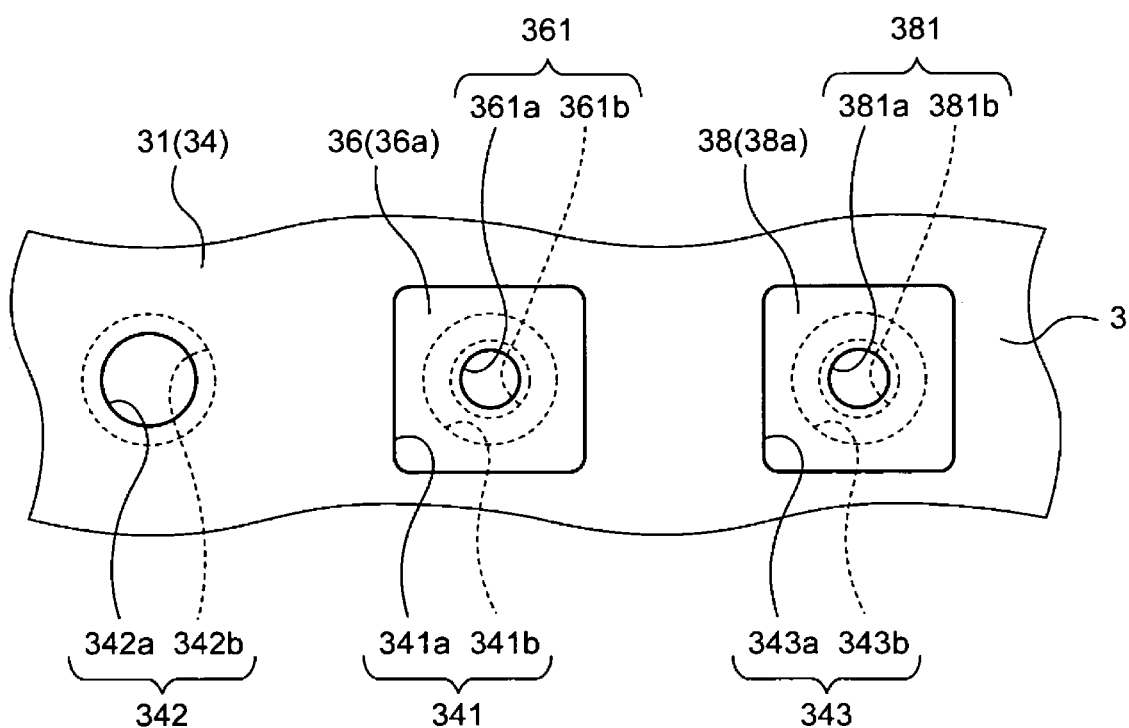
FIG. 4 is a top view of part of the conductive contact holder illustrated in FIG. 3.

FIG. 2 is a diagram of detailed structures of the conductive contact holder 3 and the conductive contacts 4. FIG. 3 is a diagram of a detailed structure of the conductive contact holder 3. FIG. 4 is a top view of the structure illustrated in FIG. 3. The conductive contact holder 3, illustrated in the drawings, includes a holder substrate 31 having a plurality of openings passing therethrough in the thickness direction thereof to hold the conductive contacts 4, a holding member 32 provided in an opening, among the openings in the holder substrate 31, for holding the signaling conductive contact 4a (a first opening 311 to be described later), and a holding member 33 provided in an opening, among the openings in the holder substrate 31, for holding the power-supplying conductive contact 4c (a third opening 313 to be described later).

The holder substrate 31 includes a first substrate 34 and a second substrate 35, each made of a conductive material such as a conductive metal or a conductive resin. These two substrates are stacked one upon the other in the thickness direction, and joined together using screwing members (not illustrated). The holder substrate 31 also includes the first opening 311, a second opening 312, and the third opening 313, each penetrating therethrough. The first opening 311, the second opening 312, and the third opening 313 house and hold therein the signaling conductive contact 4a, the grounding conductive contact 4b, and the power-supplying conductive contact 4c, respectively. The thickness of the first substrate 34 and that of the second substrate 35 are generally different.

The first substrate 34 has fourth openings 341 and 343, respectively, at the positions corresponding to the positions where the first opening 311 and the third opening 313 are formed, and a fifth opening 342 at a position corresponding to the position where the second opening 312 is formed.

The fourth opening 341 opens to the surface of the first substrate 34 not in contact with the second substrate 35, and has a shape of a stepped hole, with a large-diameter portion 341a having a cross section that is square in shape, and a small-diameter portion 341b having a smaller diameter than the large-diameter portion 341a and a cross section that is circular in shape. The fourth opening 343 also has a shape of a stepped hole in the same manner as the fourth opening 341, and includes a large-diameter portion 343a and a small-diameter portion 343b.

The fifth opening 342 includes a small-diameter portion 342a that opens to the surface of the first substrate 34 not in contact with the second substrate 35, and a large-diameter portion 342b having a larger diameter than the small-diameter portion 342a. The small-diameter portion 342a and the large-diameter portion 342b both have a cross section that is circular in shape.

The second substrate 35 is formed with sixth openings 351 and 353, respectively, at the positions corresponding to the positions where the first opening 311 and the third opening 313 are formed, and with a seventh opening 352 at a position corresponding to the position where the second opening 312 is formed. The sixth openings 351 and 353 respectively include large-diameter portions 351a and 353a having a cross section that is square in shape, and small-diameter portions 351b and 353b having a cross section that is circular in shape, in a similar manner as in, for example, the fourth opening 341. The seventh opening 352 includes a small-diameter portion 352a and a large-diameter portion 352b, both having a cross section that is circular in shape, in the same manner as in the fifth opening 342.

With the first substrate 34 and the second substrate 35 stacked one upon the other, the fourth opening 341 and the sixth opening 351 are positioned along the same axis to form the first opening 311. Moreover, with the first substrate 34 and the second substrate 35 stacked one upon the other, the fifth opening 342 and the seventh opening 352 are positioned along the same axis to form the second opening 312. The fourth opening 343 and the sixth opening 353 are positioned along the same axis to form the third opening 313.

Each of these openings is formed on the first substrate 34 and the second substrate 35 by performing thereto drilling, etching, or punching, or processing the first substrate 34 and the second substrate 35 with a laser, an electron beam, an ion beam, or by way of a wire electric discharge.

A free-machining material, such as brass, copper, or aluminum, is generally used for the conductive material making up the holder substrate 31. When the size of the holder substrate 31 is between 8 to 12 inches, Invar or Kovar material (registered trademark) may be used. By using such a conductive material, the thermal expansion coefficient of the holder substrate 31 can be brought closer to that of silicon that is the base material of the semiconductor integrated circuit 100. Thus, it is possible to form the conductive contact holder 3 and the conductive contact unit 1 that can be used in a stable manner regardless of the temperature change of the semiconductor integrated circuit 100 that is to be inspected. From the perspective of the holder substrate 31 being effective for a grounding function and an electrical-field shielding function, it is preferable to use a conductive material with low volume resistivity, in a range of 1 to 100 μΩ·cm, and high abrasion resistance, for example, gunmetal or beryllium copper.

Because the holder substrate 31 also functions to supply the ground potential, it is preferable for the electrical contact resistance between the first substrate 34 and the second substrate 35 to be as low as possible. Therefore, it is preferable to smooth out or to provide a surface treatment, such as nickel plating and gold plating, to the contact surface where the first substrate 34 and the second substrate 35 contact each other.

A structure of the holding member 32 disposed in the first opening 311 will now be explained. The holding member 32 includes a first holding member 36 disposed in the first substrate 34, and the second holding member 37 disposed in the second substrate 35. Of these two members, the first holding member 36 is made of an insulating material that is tightly filled in the fourth opening 341, and has a hole 361 provided therethrough so that the signaling conductive contact 4a can be inserted therein. The first holding member 36 further includes a flange 36a made of the insulating material filled in the large-diameter portion 341a, and a cylinder 36b made of the insulating material tightly filled in the small-diameter portion 341b. The hole 361 includes a small-diameter hole 361a that opens to the surface of the first substrate 34 not in contact with the second substrate 35, and a large-diameter hole 361b that has a larger diameter than the small-diameter hole 361a. Both of the small-diameter hole 361a and the large-diameter hole 361b have a cross section that is circular in shape.

The second holding member 37 of the holding member 32 is made of an insulating material that is tightly filled in the sixth opening 351, and has a hole 371 provided therethrough so that the signaling conductive contact 4a can be inserted therein. The second holding member 37 further includes a flange 37a made of the insulating material filled in the large-diameter portion 351a, and a cylinder 37b made of the insulating material tightly filled in the small-diameter portion 351b. The hole 371 includes a small-diameter hole 371a that opens to the surface of the second substrate 35 not in contact with the first substrate 34, and a large-diameter hole 371b that has a larger diameter than the small-diameter hole 371a but the same diameter as the large-diameter hole 361b of the hole 361. The small-diameter hole 371a and the large-diameter hole 371b also have a cross section that is circular in shape.

The holding member 33 disposed in the third opening 313 includes a first holding member 38 disposed in the first substrate 34, and a second holding member 39 disposed in the second substrate 35. Of these two members, the first holding member 38 is made of an insulating material that is tightly filled in the fourth opening 343, and has a hole 381 provided therethrough so that the power-supplying conductive contact 4c can be inserted therein. The first holding member 38 further includes a flange 38a made of the insulating material filled in the large-diameter portion 343a, and a cylinder 38b made of the insulating material tightly filled in the small-diameter portion 343b. The hole 381 includes a small-diameter hole 381a that opens to the surface of the first substrate 34 not in contact with the second substrate 35, and a large-diameter hole 381b that has a larger diameter than the small-diameter hole 381a. Both of the small-diameter hole 381a and the large-diameter hole 381b have a cross section that is circular in shape.

The second holding member 39 of the holding member 33 is made of an insulating material that is tightly filled in the sixth opening 353, and has a hole 391 provided therethrough so that the power-supplying conductive contact 4c can be inserted therein. The second holding member 39 further includes a flange 39a made of the insulating material filled in the large-diameter portion 353a, and a cylinder 39b made of the insulating material tightly filled in the small-diameter portion 353b. The hole 391 includes a small-diameter hole 391a that opens to the surface of the second substrate 35 not in contact with the first substrate 34, and a large-diameter hole 391b that has a larger diameter than the small-diameter hole 391a but the same diameter as the large-diameter hole 381b of the hole 381. The small-diameter hole 391a and the large-diameter hole 391b also have a cross section that is circular in shape.

Fluorine resin is suited for the insulating material used for the holding members 32 and 33 having the structures described above. Fluorine resin has excellent heat resistance, and its maximum operation temperature is 260 C.°. Therefore, it can sufficiently tolerate the high temperature environment during the inspections. The fluorine resin also has dielectric strength of 19 MV/m that is an insulating capability as high as other insulating materials. Furthermore, the fluorine resin can be easily cleaned when the surface thereof is contaminated. In addition, because fluorine resin also has high flexibility and adhesiveness, the fluorine resin is not likely to peel off by, for example, scratching. Therefore, fluorine resin is a suitable material for ensuring electrical insulation between the signaling conductive contact 4a or the power-supplying conductive contact 4c and the holder substrate 31.

One example of such fluorine resin is Teflon (registered trademark). Teflon (registered trademark) can easily be processed and has low specific inductive capacity $\in_r$ of 2.1. Therefore, in comparison with those made of other materials, the signaling conductive contact 4a or the power-supplying conductive contact 4c can be made larger in the outer diameter to achieve a structure with the same intrinsic impedance (50Ω). By using a material having a low specific inductive capacity $\in_r$, the holding members 32 and 33 can be made smaller in the outer diameter. In this manner, the adjacent conductive contacts 4 can more narrowly be spaced, and the semiconductor integrated circuit 100 with narrowly spaced connecting electrodes 101 can be supported. Furthermore, the electrical resistance of the signaling conductive contact 4a can be reduced. At the same time, the attenuation of transmitted signals can be suppressed.

Alternatively, the holding members 32 and 33 may be made of an insulating material such as ethylene-tetrafluoroethylene (ETEF: with $\in_r$ approximately 2.6), high density polyethylene (HDPE: with $\in_r$ approximately 2.3), or polypropylene (with $\in_r$ between 2.0 to 2.3).

Structures of the conductive contacts 4 will now be explained with reference to FIG. 2. The signaling conductive contact 4a includes a needle-shaped member 41 that is in contact with a signaling electrode 2a provided on the circuit board 2, a needle-shaped member 42 that is in contact with the connecting electrode (bump) 101, approximately a sphere in shape, provided on the semiconductor integrated circuit 100, and a spring member 43 that is disposed between the needle-shaped member 41 and the needle-shaped member 42 to electrically connect the needle-shaped members 41 and 42, and enables elastic movement of the signaling conductive contact 4a in a longitudinal direction. The needle-shaped members 41, 42, and the spring member 43 are held in the first opening 311 so that each axial line thereof is aligned with that of the first opening 311, and therefore, movable in the axial direction.

The needle-shaped member 41 has a pointed end toward the circuit board 2, and the pointed end is in contact with the signaling electrode 2a arranged on the circuit board 2. The needle-shaped member 41 can be moved in axial direction by way of an extending force of the spring member 43. The needle-shaped member 41 can be brought in contact with the signaling electrode 2a in the most suitable manner, by cooperating with the shape of the signaling electrode 2a upon contact, and with a reduced contact resistance thanks to a pressing force generated by the spring member 43 in an extending direction thereof.

The needle-shaped member 41 also has a flange 411 protruding in a direction perpendicular to the axial line thereof. The diameter of the flange 411 is greater than that of the small-diameter hole 371a located at the proximity of the bottom surface of the holder substrate 31. By way of the small-diameter hole 371a, a needle-shaped member 44 is prevented from being disengaged.

The needle-shaped member 42 has a crown-shaped end protruding toward the semiconductor integrated circuit 100. During an inspection, this end is in contact with the connecting electrode 101 on the semiconductor integrated circuit 100. In the same manner as the needle-shaped member 41, the needle-shaped member 42 can be moved in the axial direction by way of the extending force of the spring member 43. The needle-shaped member 42 is also provided with a flange 421, protruding in a direction perpendicular to the axial line thereof. The diameter of the flange 421 is greater than that of the small-diameter hole 361a. By way of the small-diameter hole 361a, the needle-shaped member 42 is prevented from being disengaged.

The power-supplying conductive contact 4c has the same structure as that of the signaling conductive contact 4a. In other words, the power-supplying conductive contact 4c also includes needle-shaped members 47 and 48, and a spring member 49, each corresponding to the needle-shaped members 41 and 42, and the spring member 43 included in the signaling conductive contact 4a. The needle-shaped members 47 and 48 are provided with flanges 471 and 481. During an inspection, the tip of the needle-shaped member 47 is brought in contact with a power-supplying electrode 2b that is provided on the circuit board 2. The needle-shaped member 48 is brought in contact with the connecting electrode 101 provided on the semiconductor integrated circuit 100.

The grounding conductive contact 4b will now be explained. The grounding conductive contact 4b includes the needle-shaped member 44 that is in contact with an grounding electrode 2G on the circuit board 2, a needle-shaped member 45 that is in electrical contact with the connecting electrode 101 on the semiconductor integrated circuit 100 during an inspection, and a spring member 46 that is disposed between the needle-shaped member 44 and the needle-shaped member 45 to electrically connect the needle-shaped members 44 and 45 and enables elastic movement of the grounding conductive contact 4b in the longitudinal direction.

Each of the needle-shaped members 44 and 45 has a structure having a flange 441 or 451, and supplies the electric potential of the holder substrate 31 as a ground potential to the semiconductor integrated circuit 100 through the flanges 441 and 451.

The insulating layer is not formed on the inner surface of the second opening 312 in the holder substrate 31. Therefore, the inner surface of the second opening 312 is brought in direct contact with the spring member 46 that shrinks by way of the elastic movement of the grounding conductive contact 4b. As a result of this contact, the grounding conductive contact 4b becomes electrically connected to the holder substrate 31, and the electric potential supplied by the grounding conductive contact 4b becomes equal to that in the holder substrate 31.

From a perspective of reducing the contact resistance between the grounding conductive contact 4b and the holder substrate 31, it is preferable to increase a contact surface therebetween. Therefore, it is preferable to make the outer diameters of the flanges 441 and 451 as large as possible, and the lengths thereof (a vertical direction in FIG. 2) are made as long as possible but not as much as to inhibit the elastic movement of the grounding conductive contact 4b. Such arrangements enable the grounding conductive contact 4b to effectively supply the ground potential from the holder substrate 31 to the semiconductor integrated circuit 100, enabling the ground potential of the semiconductor integrated circuit 100 to be stabilized.

A material for reducing the electrical contact resistance, such as a contact cleaner, may be provided to the outer surface of the grounding conductive contact 4b, that is, for example, on the outer circumference of the flanges 441 and 451. Thus, signal transmission loss will not increase even when a high-frequency signal is supplied to the semiconductor integrated circuit 100.

A method of manufacturing the conductive contact holder according to the first embodiment will now be explained. FIGS. 5 to 9 are diagrams, arranged in sequence of time, of steps of providing each of the openings to the first substrate 34, and forming the first holding member 36 and the like.

Figure 5:
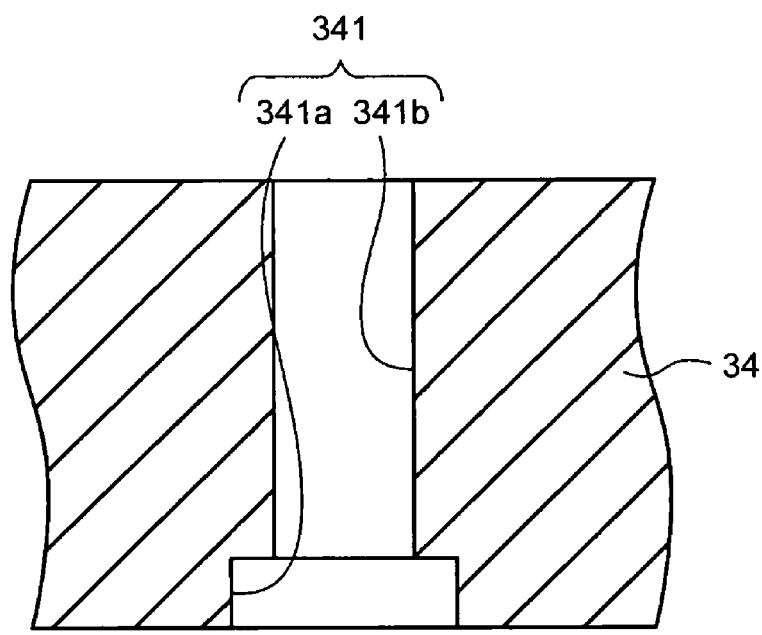
FIG. 5 is a diagram of a first substrate formed with a fourth opening in a method of manufacturing the conductive contact holder according to the first embodiment.

First, as illustrated in FIG. 5, the fourth opening 341 is formed. At this time, the first substrate 34 is drilled, etched, punched, or processed with a laser, an electron beam, an ion beam, or by way of a wire electric discharge to obtain the fourth opening 341. The fourth opening 343 and the fifth opening 342 are formed in the same manner as the fourth opening 341.

Figure 6:
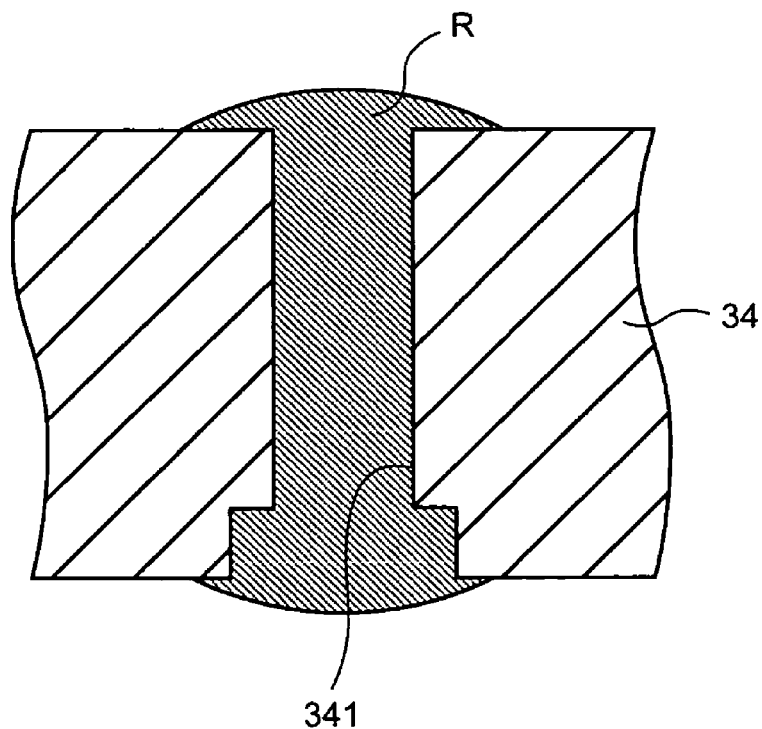
FIG. 6 is a diagram of the fourth opening filled with an insulating material in the method of manufacturing the conductive contact holder according to the first embodiment.

In an atmosphere where the air is sucked while pressure is being applied, fluorine resin in liquid state is filled in the fourth openings 341 and 343. FIG. 6 is a diagram of the state where the fourth opening 341 is filled with fluorine resin R. Upon filling the fluorine resin, the fluorine resin R is poured in an amount slightly greater than the volume of the fourth opening 341, whereby the fluorine resin R rises at the proximity of the surfaces of the first substrate 34 (the fourth opening 343 is filled in the same manner). By filling the fourth opening 341 with the fluorine resin R so that the fluorine resin R rises, even if the fluorine resin R shrinks after being hardened, it is possible to prevent formation of a cavity in the fourth opening 341, or prevent the fluorine resin R from peeling-off from the inner circumference of the fourth opening 341. If adhesiveness of the fluorine resin R with a metal is not sufficiently high, a pressure may be added while the fourth opening 341 is filled with fluorine resin R, or a primer may be applied to the fourth opening 341 to improve the adhesiveness.

Figure 7:
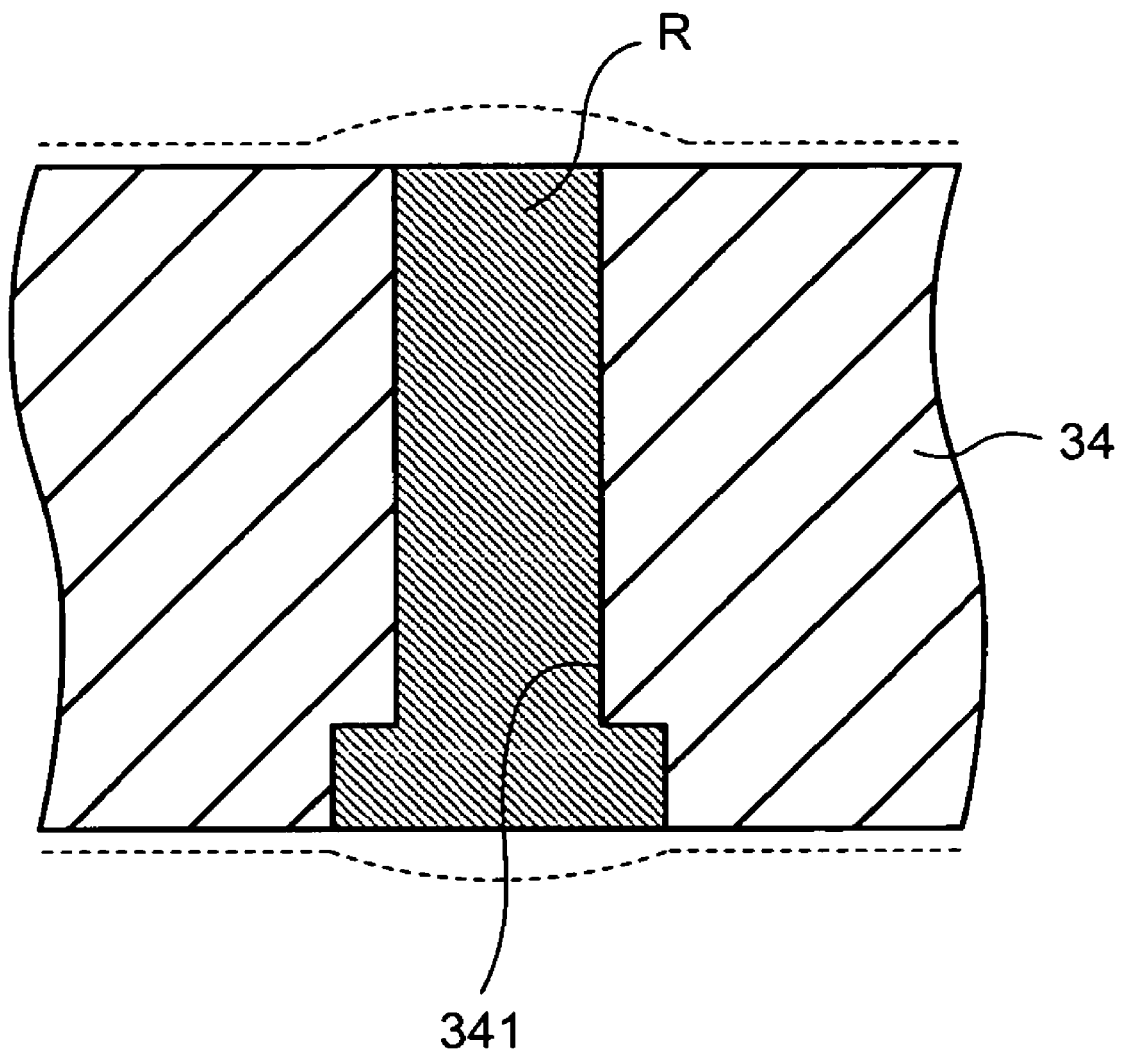
FIG. 7 is a diagram of the first substrate having a surface thereof machined in the method of manufacturing the conductive contact holder according to the first embodiment.

After the fluorine resin R hardens, the surface of the first substrate 34 is machined as illustrated in FIG. 7. Thus, the surface of the first substrate 34 and that of the fluorine resin R are smoothed out and become coplanar. When the holder substrate 31 is formed of two substrates stacked one upon the other, the surfaces of the two substrates do not exactly meet each other unless the surface of the fluorine resin R and that of the first substrate 34 are coplanar. When the surfaces of the two substrates do not exactly meet each other, a large gap may be formed between these two substrates. If this occurs, the electrical characteristics of a high frequency signal could degrade in the conductive contact holder. According to the first embodiment, these surfaces are machined so that the surface of the fluorine resin R and that of the first substrate 34 becomes coplanar highly precisely, thus preventing the degradation of the electrical characteristics of the high frequency signal. The surface of the fluorine resin R and that of the first substrate 34 may also be polished to obtain the smooth surface.

Figure 8:
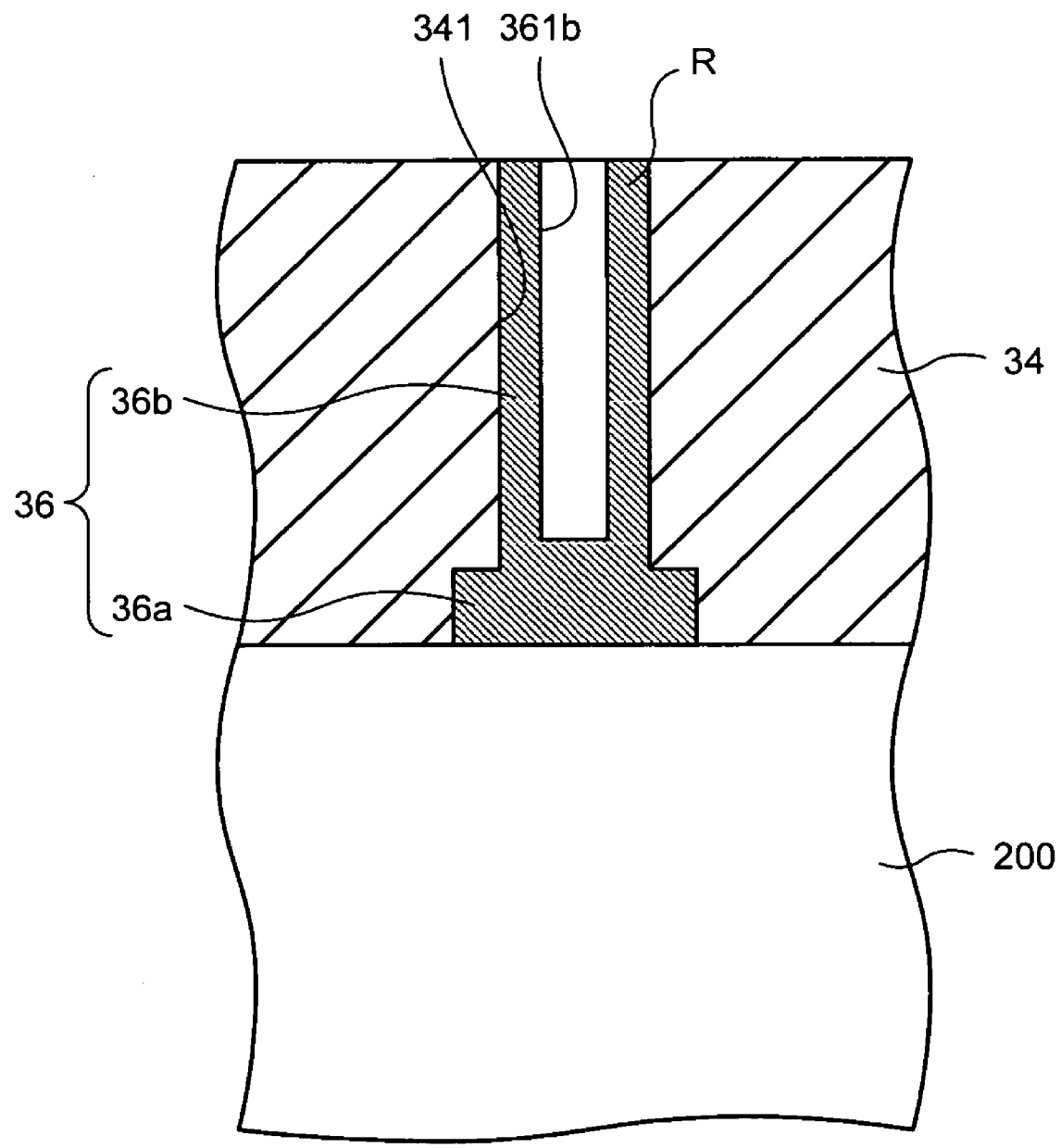
FIG. 8 is a diagram of a large-diameter hole formed in the insulating material filling the fourth opening in the method of manufacturing the conductive contact holder according to the first embodiment.

The first substrate 34 is then placed, with the flange 36a facing downward, on a workstation 200, and a hole is formed in the fluorine resin R. First, the large-diameter hole 361b is formed by way of drilling as illustrated in FIG. 8.

According to a conventional method, when a hole is formed by drilling, the fluorine resin may cling to the rotating drill, and be peeled off from the inner circumference of the opening. Then, upon removing the drill after forming the hole, the fluorine resin R may come off in the direction the drill is removed. Concerning this issue, according to the first embodiment, the flange 36a, having a cross section that is square in shape, is formed with the fluorine resin R. Therefore, the fluorine resin R does not come off in the direction that the drill is removed along the normal line of the surface of the first substrate 34 not having the flange 36a, nor rotate along with the rotating drill. In this sense, the flange 36a functions as a disengagement preventer that prevents the fluorine resin R from being disengaged in the direction of the normal line of at least one of the surfaces of the holder substrate 31, as well as a rotation preventer that prevents the fluorine resin R from rotating around an axis perpendicular to the surface of the holder substrate 31.

To prevent the fluorine resin R from rotating with the rotating drill, the flange 36a may also be polygonal, not square, in shape. These "square in shape" or "polygonal in shape" includes those having a tip of the corners thereof chamfered.

Figure 9:
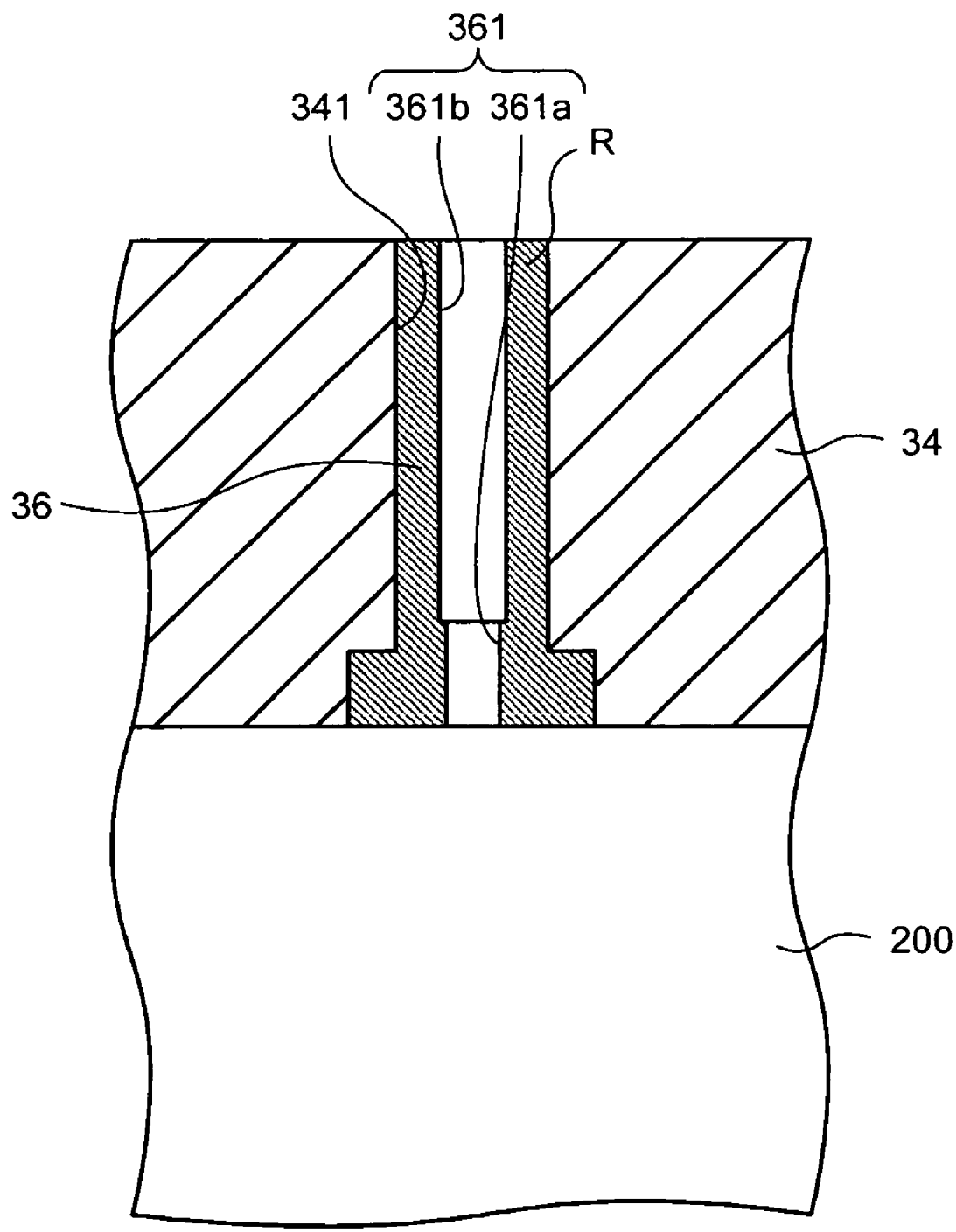
FIG. 9 is a diagram of a small-diameter hole formed in the insulating material filling the fourth opening in the method of manufacturing the conductive contact holder according to the first embodiment.

Then, a hole is formed for the small-diameter hole 361a. At this time, a drill, matching the diameter of the small-diameter hole 361a, is inserted into the fluorine resin R from the opened end of the large-diameter hole 361b, and the small-diameter hole 361a is formed along the same axis as that of the large-diameter hole 361b. As a result, the hole 361 is created as illustrated in FIG. 9, and the first holding member 36 is obtained.

Alternatively, upon forming the hole 361, the hole may be processed at first for the small-diameter hole 361a. More specifically, after forming a penetrating hole, having the same diameter as the small-diameter hole 361a, penetrating the first substrate 34 in the thickness direction, the large-diameter hole 361b may be formed along the same axis as that of the penetrating hole.

The first holding member 38, formed by providing the hole 381 through the fourth opening 343 on the first substrate 34, can be also formed according to the same process for forming the first holding member 36.

The process of forming the first holding member 36 in the fourth opening 341 of the first substrate 34 is explained in detail so far. With the same process, the second holding members 37 and 39 are also processed in the sixth openings 351 and 353 provided in the second substrate 35.

The first substrate 34 is placed, with a surface thereof facing the semiconductor integrated circuit 100 positioned vertically bottom, the conductive contacts 4, each corresponding to the fourth openings 341 and 343 and the fifth opening 342 formed on the first substrate 34, are inserted. The second substrate 35 is then aligned to the first substrate 34, placed thereon from the vertical top, and fixed onto the first substrate 34 by way of screws, for example. In this manner, the conductive contact holder 3 is finished.

For the purpose of aligning the first substrate 34 and the second substrate 35, each of these substrates may be provided with an aligning opening, and an aligning pin may be inserted therethrough to achieve the alignment.

Furthermore, to improve the electrical contact between the grounding conductive contact 4b and the holder substrate 31, surface treatment may be applied to the inner circumference of the fifth opening 342 that is capable of providing thereto an abrasion resistance and improved conductivity. An example of surface treatment is gold plating.

The conductive contact unit 1, obtained by assembling necessary members such as the holder member 5 and the circuit board 2 to the conductive contact holder 3 manufactured according to the method described above, can be easily assembled and disassembled. Therefore, the conductive contact unit 1 can be easily maintained, for example, the conductive contact 4 may be easily replaced or repaired.

As described above, according to the first embodiment, the holding member is formed by filling the openings (the fist and the third openings) in the holder substrate with an insulating material. After surface machining to make the surface of the insulating material and that of the holder substrate coplanar, the holes are formed for inserting the conductive contacts. Therefore, the holding member that can hold the narrow-pitched conductive contacts having a small diameter can be easily assembled to the holder substrate. Thus, it is possible to provide an easily manufactured conductive contact holder and a conductive contact unit capable of supporting a high frequency signal and a highly integrated and downsized inspection object, and a method of manufacturing such a conductive contact holder.

Furthermore, according to the first embodiment, the holding member includes the flange that functions as a disengagement preventer for preventing the fluorine resin from being disengaged in the direction of the normal line of at least one of the surfaces of the holder substrate, as well as a rotation preventer for preventing the fluorine resin from rotating around an axis perpendicular to the surface of the holder substrate. Therefore, it is not likely that the insulating material peels off from the holder substrate during the hole machining. As a result, an adhesive need not to be applied between the insulating material, making up the holding member, and the holder substrate. Accordingly, processes can be skipped that are difficult to be performed in an extremely small area, making manufacturing of a conductive contact holder easier.

Modification of First Embodiment

These structures of the first substrate and the second substrate included in the holder substrate according to the first embodiment are not limited to those described above. Other possible modifications of the first substrate will be explained below. Obviously, similar modifications are also possible for the second substrate.

Figure 10:
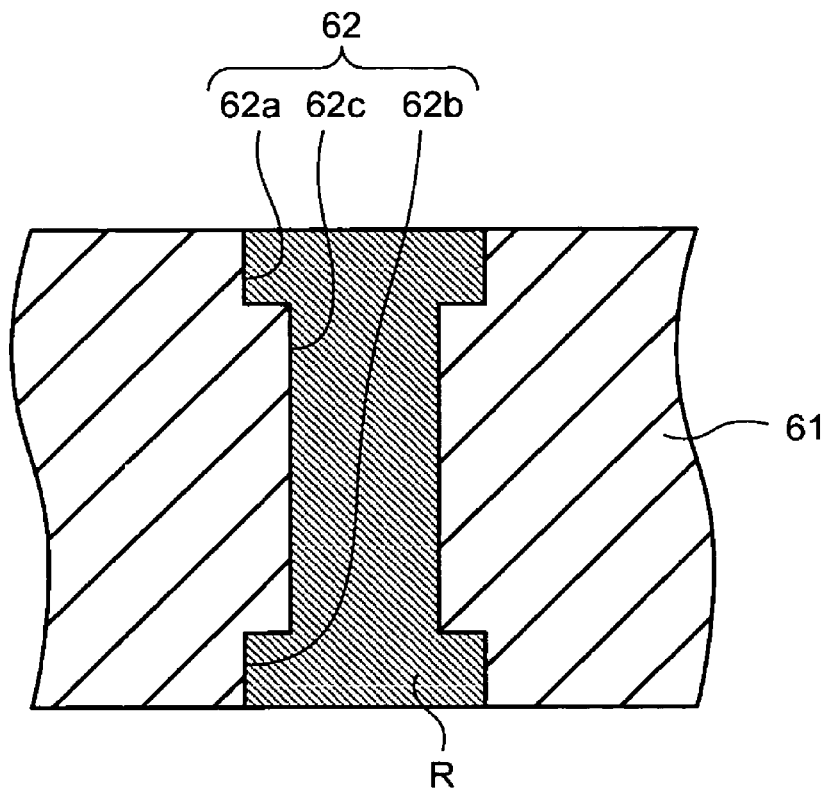
FIG. 10 is a diagram of a structure of relevant part of a conductive contact holder according to a first modification of the first embodiment.
Figure 11:
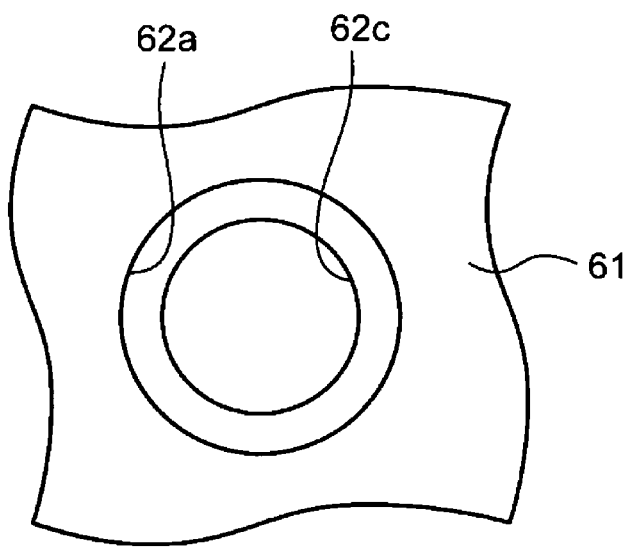
FIG. 11 is a diagram of a structure of relevant part of a first substrate of the conductive contact holder according to the first modification of the first embodiment.

FIG. 10 is a diagram of a modification (a first modification) of the first substrate. A fourth opening 62, provided to a first substrate 61 illustrated in FIG. 10, includes large-diameter portions 62a and 62b provided at each end of the first substrate 61 and having the same cross sectional shape, and a small-diameter portion 62c arranged between the large-diameter portions 62a and 62b. FIG. 11 is a top view of relevant part of the first substrate 61. As illustrated in FIG. 11, the large-diameter portion 62a (and 62b) and the small-diameter portion 62c have a cross section that is circular in shape.

The fourth opening 62 having such a structure can be processed easily, and is vertically symmetrical. Therefore, the holes for inserting the signaling conductive contact 4a or the power-supplying conductive contact 4c can be easily formed in the fluorine resin R filled in the fourth opening 62. Furthermore, the fluorine resin R, filled in the large-diameter portions 62a and 62b, has flanges with a diameter larger than the fluorine resin R filled in the small-diameter portion 62c. Thus, the fluorine resin R, in the large-diameter portions 62a and 62b, functions as a disengagement preventer, while the holes, for inserting the signaling conductive contact 4a or the power-supplying conductive contact 4c, are formed.

Figure 12:
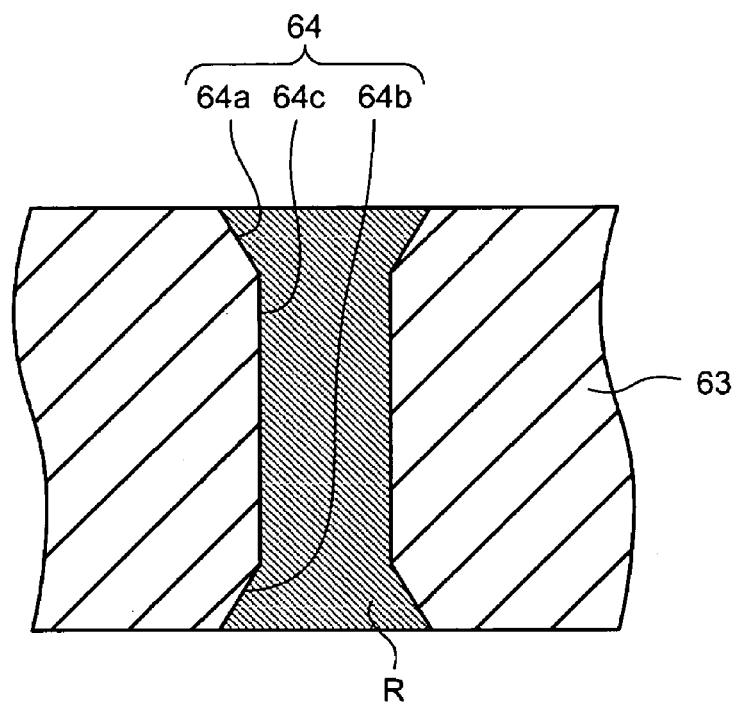
FIG. 12 is a diagram of a structure of relevant part of a conductive contact holder according to a second modification of the first embodiment.

FIG. 12 is a diagram of another modification (a second modification) of the first substrate. A fourth opening 64, provided to a first substrate 63 illustrated in FIG. 12, includes tapered portions 64a and 64b provided at each end of the first substrate 63 and having a diameter that is largest at the surface thereof and becoming smaller along the thickness direction thereof, and a small-diameter portion 64c arranged between the tapered portions 64a and 64b and having the same diameter as the smallest diameter of the tapered portions 64a and 64b. This fourth opening 64 can also be processed easily, and is vertically symmetrical. Therefore, the holes for inserting the signaling conductive contact 4a or the power-supplying conductive contact 4c can be easily formed in the fluorine resin R filled in the fourth opening 64. Furthermore, the tapered portions 64a and 64b function as a disengagement preventer. By forming the cross section of the tapered portions 64a and 64b polygonal in shape, the tapered portions 64a and 64b can also function as a rotation preventer.

Figure 13:
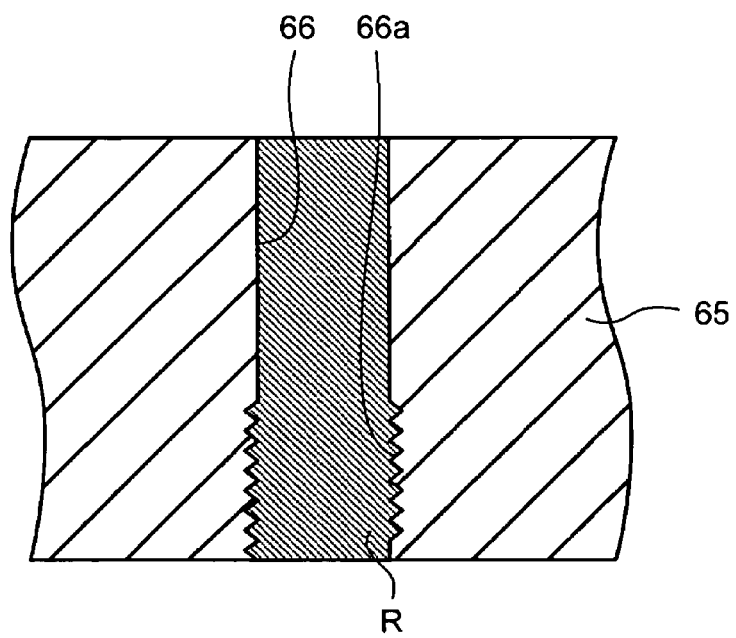
FIG. 13 is a diagram of a structure of relevant part of a conductive contact holder according to a third modification of the first embodiment.

FIG. 13 is a diagram of another modification (a third modification) of the first substrate. A fourth opening 66, provided to a first substrate 65 illustrated in FIG. 13, includes a thread 66a having a cross section that is circular in shape, and provided by way of a tap at proximity of one of the opened ends. The thread 66a is preferably cut into the fluorine resin R, filled in the fourth opening 66, in the direction that does not cause the fluorine resin R to rotate along with the rotating drill, used for forming the holes for inserting the signaling conductive contact 4a or the power-supplying conductive contact 4c, while the drill is being removed. The thread 66a functions as a disengagement preventer and also a rotation preventer. Instead of forming the thread 66a, the fourth opening 66 may also be structured to have a vertical cross section with an alternating recess and protrusion, whose diameter becomes larger and smaller in the direction perpendicular to the thickness direction of the first substrate 65 along the thickness direction thereof.

Figure 14:
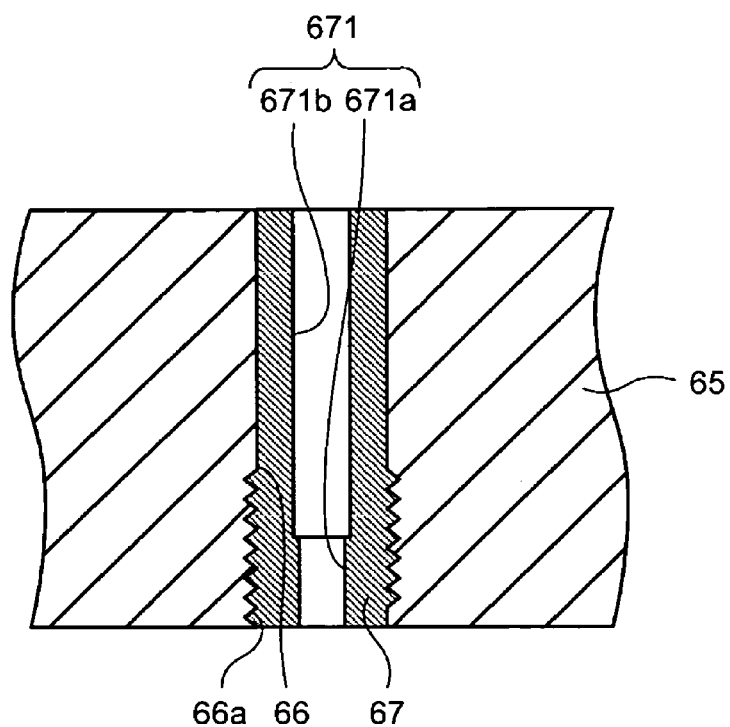
FIG. 14 is a diagram of a hole formed in a resin filling the first substrate illustrated in FIG. 13.

FIG. 14 is a diagram of a state where the first holding member is formed with the fluorine resin R, filled in the fourth opening 66, formed with a hole for inserting the signaling conductive contact 4a or the power-supplying conductive contact 4c. A hole 671 formed on a first holding member 67, illustrated in FIG. 14, have a small-diameter hole 671a that opens to the surface where the thread 66a is formed, and a large-diameter hole 671b that opens to the surface where the thread 66a is not formed. By forming the small-diameter hole 671a in the side of the fourth opening 66 formed with the thread 66a, the fluorine resin R can be prevented from being disengaged from the first substrate 65 during the hole machining.

Figure 15:
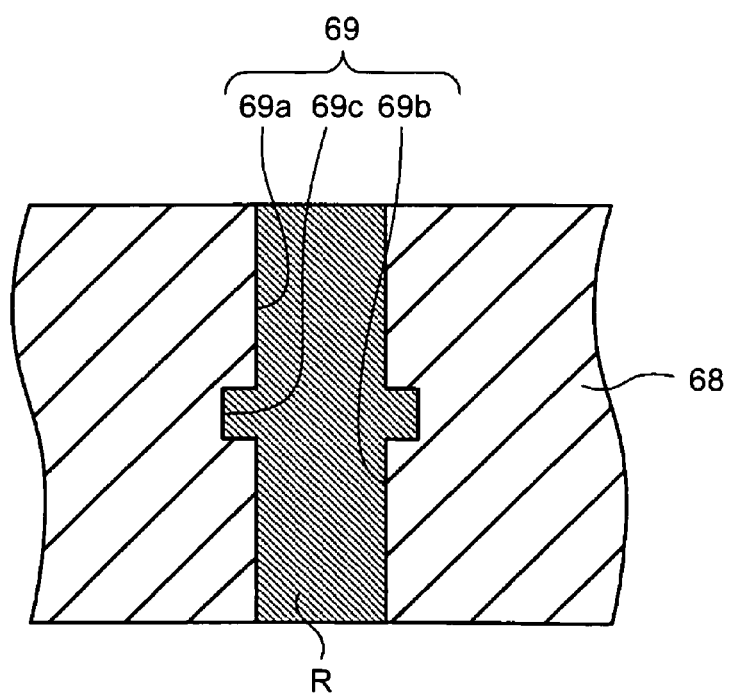
FIG. 15 is a diagram of a structure of relevant part of a conductive contact holder according to a fourth modification of the first embodiment.

FIG. 15 is a diagram of another modification (a fourth modification) of the first substrate. A fourth opening 69, provided in a first substrate 68 illustrated in FIG. 15, includes small-diameter portions 69a and 69b, each facing each end of the first substrate 68 and having the same diameter, and a large-diameter portion 69c provided in the middle in the thickness direction of the first substrate 68 and having a larger diameter than the small-diameter portions 69a and 69b. While the holes, for inserting the signaling conductive contact 4a or the power-supplying conductive contact 4c, are formed in the fluorine resin R filled in the fourth opening 69, the large-diameter portion 69c functions to prevent the fluorine resin R from being disengaged from the first substrate 68. By making the cross section of the large-diameter portion 69c polygonal in shape, the large-diameter portion 69c can also function as a rotation preventer.

Figure 16:
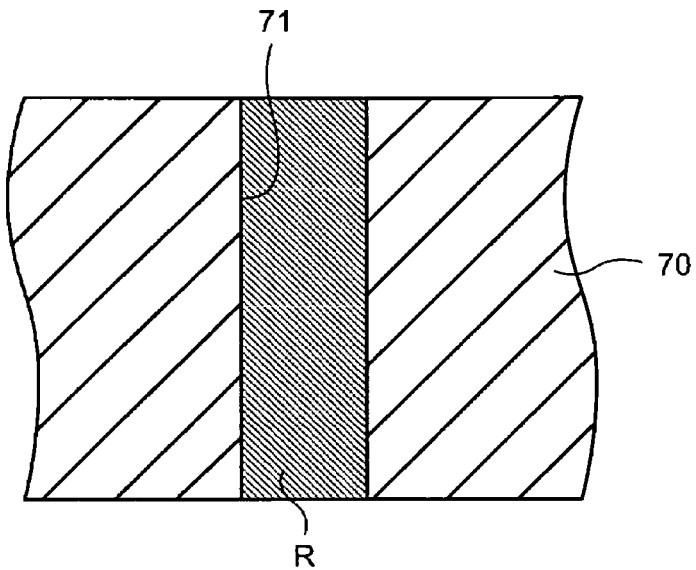
FIG. 16 is a diagram of a structure of relevant part of a conductive contact holder according to a fifth modification of the first embodiment.

FIG. 16 is a diagram of another modification (a fifth modification) of the first substrate. A first substrate 70 illustrated in FIG. 16 includes a fourth opening 71 having a uniform diameter. This modification may be applied when sufficient adhesiveness can be ensured between the resin R, filled in the fourth opening 71, and the first substrate 70, and the resin R is extremely less likely to be disengaged or rotated while forming the hole for inserting the signaling conductive contact 4a or the power-supplying conductive contact 4c.

Second Embodiment

Figure 17:
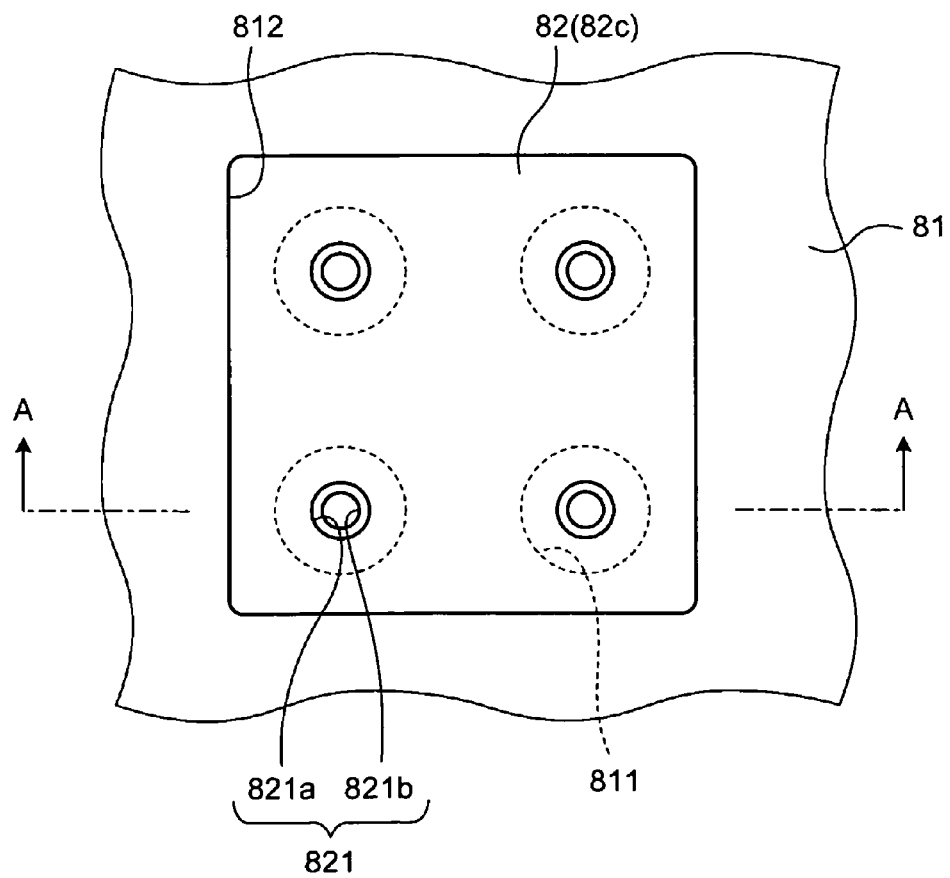
FIG. 17 is a top view of a structure of relevant part of a conductive contact holder according to a second embodiment of the present invention.
Figure 18:
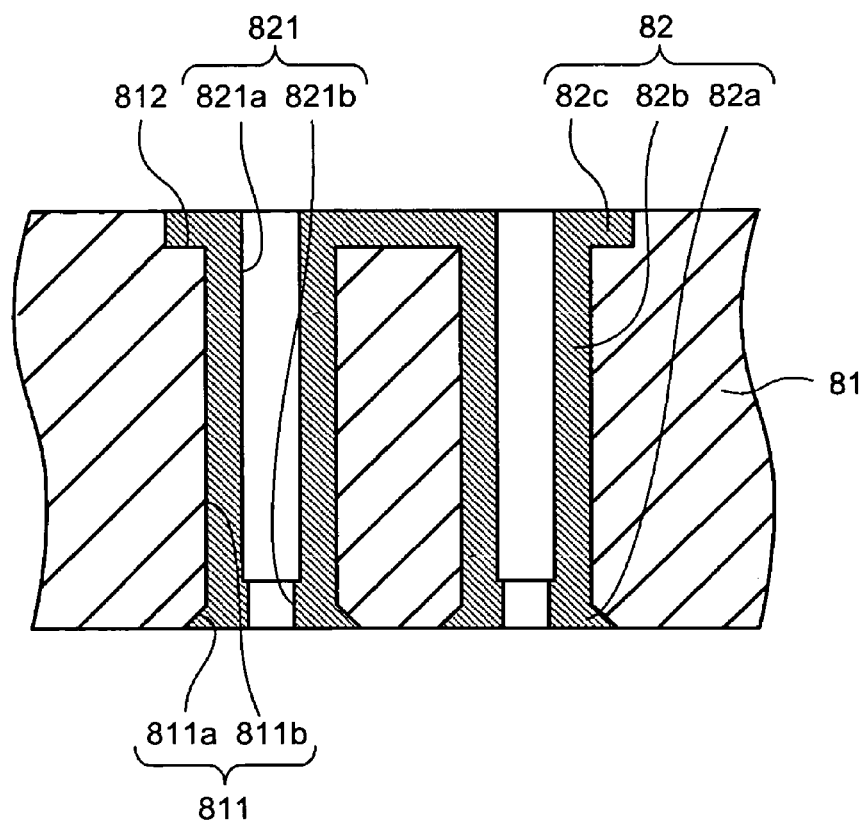
FIG. 18 is a cross sectional view taken along line A-A of FIG. 17.

FIG. 17 is a top view of relevant part of a first substrate included in a conductive contact holder according to a second embodiment of the present invention. FIG. 18 is a cross sectional view of the first substrate along the line A-A illustrated in FIG. 17. A first substrate 81 illustrated in the diagrams have a plurality of fourth openings 811 that hold therein the signaling conductive contact 4a or the power-supplying conductive contact 4c, and a recess 812 that is drilled off from the surface of the first substrate 81 by a predetermined depth (preferably, approximately 20 to 50 micrometers) arranged to be abutted to the fourth openings 811, and having open ends of these fourth openings 811 on the bottom surface. Although not illustrated, a fifth opening, for holding the grounding conductive contact 4b, is also formed in the first substrate 81.

The fourth opening 811 includes a tapered portion 811a provided at one end of the first substrate 81, and having a diameter that is largest on the surface of the first substrate 81 and becoming smaller along the thickness direction thereof, and a small-diameter portion 811b that is located between the tapered portion 811a and the recess 812, and having the same diameter as the smallest diameter of the tapered portion 811a.

A first holding member 82, made of the insulating material such as fluorine resin filled in the fourth opening 811 and the recess 812, includes a tapered portion 82a made of the insulating material tightly filled in the tapered portion 811a, a cylinder 82b made of the insulating material tightly filled in the small-diameter portion 811b, and a coat 82c made of the insulating material tightly filled in the recess 812. A hole 821 formed in the first holding member 82 has a shape of a stepped hole including a large-diameter hole 821a and a small-diameter hole 821b. Both of the large-diameter hole 821a and the small-diameter hole 821b have a cross section that is circular in shape.

The tapered portion 82a functions as a disengagement preventer that prevents the first holding member 82 from being disengaged in the normal direction of the surface having the coat 82c, while the hole 821 is formed. The coat 82c also functions as a rotation preventer that prevents the first holding member 82 from rotating around an axis perpendicular to the surface of the first substrate 81 while the hole 821 is formed.

As described above, the first holding member 82 includes the coat 82c made of the insulating material located along the surface of the first substrate 81. Therefore, the connecting electrodes 101, arranged on the semiconductor integrated circuit 100, can be reliably insulated from the surface of the holder substrate (the first substrate 81). Thus, short circuiting due to the connecting electrodes 101 being in contact with the surface of the holder substrate can be prevented.

According to the second embodiment, a second substrate and a second holding member have the same structures as the first substrate and the first holding member, respectively (not illustrated). Thus, the second holding member can reliably insulate the various electrodes, such as the signaling electrode 2a provided on the circuit board 2, from the surface of the holder substrate (the second substrate). Accordingly, short circuiting due to these electrodes being in contact with the surface of the holder substrate can be prevented.

FIG. 17 illustrates the arrangement pattern by way of example only. For example, when the fifth opening, for inserting the grounding conductive contact 4b, is located near the fourth opening 811, the recess may be formed so that the end of the fifth opening is not included in the bottom of the recess. The recess may be formed so that the end of the fifth opening is included therein; however, in such an arrangement, it is preferable to at first fill the recess with the insulating material to form the coat, and then to form the fifth opening, to prevent the insulating material from entering the fifth opening.

When the first holding member 82 is formed, the fourth opening 811 and the recess 812 are filled with the insulating material. At this time, the insulating material is filled so that the insulating material rises from the surface of the first substrate 81. The surface is then machined to smooth out the surface of the first substrate 81 and that of the insulating material, and holes are processed in the order of the large-diameter hole 821a and the small-diameter hole 821b to obtain the hole 821.

The structure of the relevant part of the first substrate 81, and the method of forming the first holding member 82 are explained so far. The relevant part of the second substrate have similar structures as those of the first substrate 81. The method of forming the second holding member, provided to the second substrate, is also similar to that of forming the first holding member 82.

Each of the structures included in the conductive contact holder and the conductive contact unit, but not described above, are same as those of the conductive contact holder 3 and the conductive contact unit 1 according to the first embodiment.

As described above, according to the second embodiment, the holding member is obtained by filling the openings (the first and the third openings), provided in the holder substrate, with the insulating material, machining the surface to make the surface of the insulating material and that of the holder substrate coplanar, and then forming the holes for inserting the conductive contacts. Therefore, it is possible to easily assemble the holding member that can hold the narrow-pitched conductive contacts with a small diameter to the holder substrate. Thus, it is possible to provide an easily manufactured conductive contact holder and a conductive contact unit capable of supporting a high frequency signal and a highly integrated and downsized inspection object, and a method of manufacturing such a conductive contact holder.

Furthermore, according to the second embodiment, the holding member includes the tapered portion that functions as a disengagement preventer for preventing the fluorine resin from being disengaged in the direction of the normal line of one of the surfaces of the holder substrate, and a coat that functions as a rotation preventer for preventing the fluorine resin from rotating around an axis perpendicular to the surface of the holder substrate. Therefore, there is no possibility for the insulating material to peel off from the holder substrate during the hole machining. As a result, it becomes unnecessary to apply adhesive between the insulating material, making up the holding member, and the holder substrate. Thus processes that are difficult to be performed in an extremely small area can be omitted. Accordingly, manufacturing of the conductive contact holder becomes easier.

Furthermore, according to the second embodiment, the insulating material is filled into a predetermined opening, and at the same time, the conductive contacts are insulated from each other with insulating coat provided therebetween on the surface of the holder substrate. In this manner, the insulating member (the cylinder and the tapered portion), having a hole for inserting the conductive contact, and the coat, covering a part of one of the surfaces of the holder substrate, can be formed simultaneously.

It should be noted that, in the second embodiment, a flange, such as in the first holding member 36 explained in the first embodiment, may be formed instead of the tapered portion as a disengagement preventer provided on, for example, the first holding member.

Modification of Second Embodiment

Figure 19:
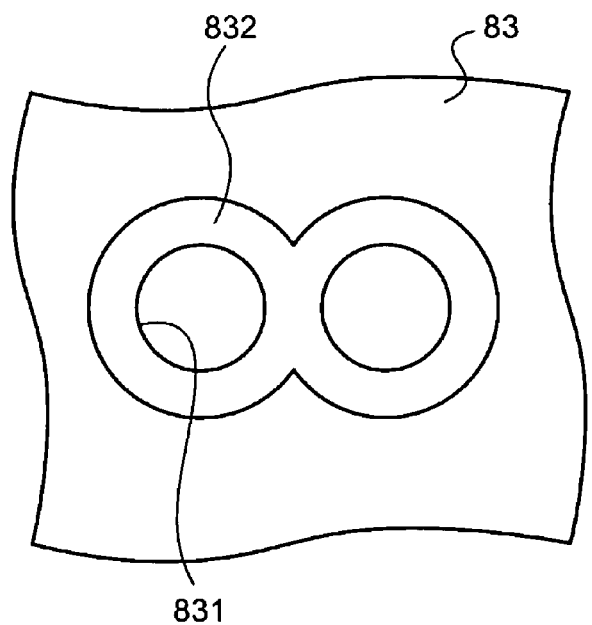
FIG. 19 is a top view of a structure of relevant part of a first substrate of a conductive contact holder according to a first modification of the second embodiment.
Figure 20:
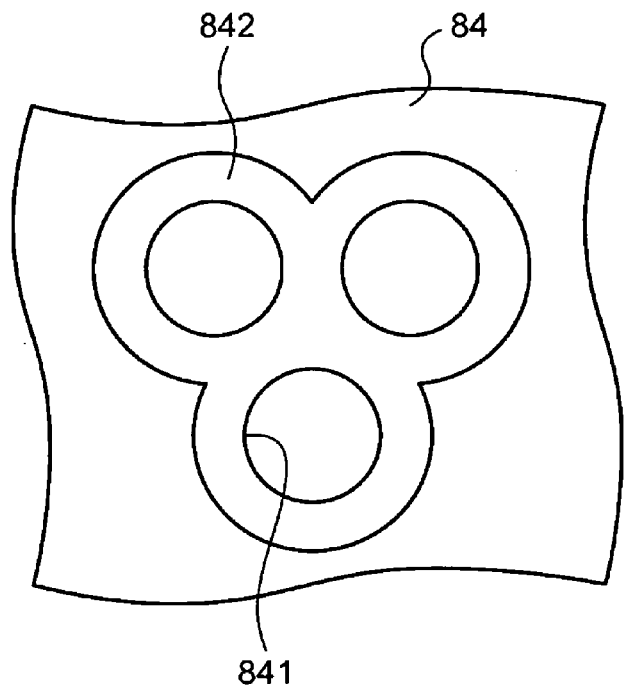
FIG. 20 is a top view of a structure of relevant part of a first substrate of a conductive contact holder according to a second modification of the second embodiment.
Figure 21:
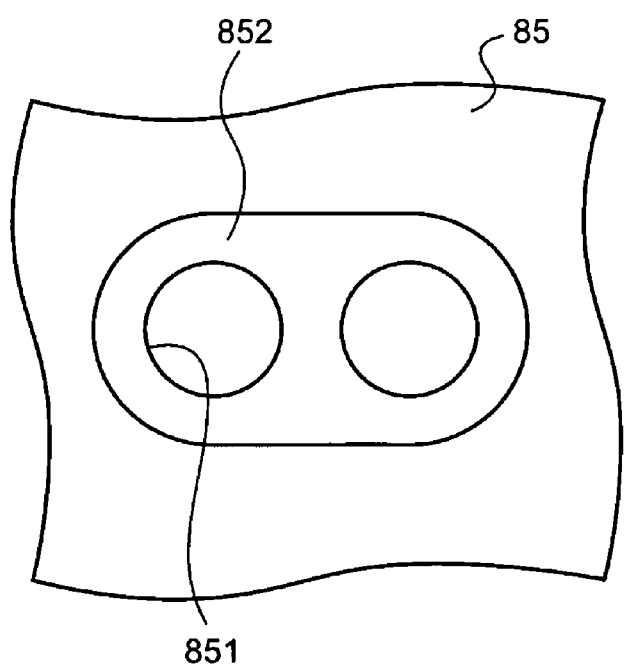
FIG. 21 is a top view of a structure of relevant part of a first substrate of a conductive contact holder according to a third modification of the second embodiment.

FIGS. 19 to 21 are top views of structures of relevant part of first substrates in conductive contact holders according to modifications of the second embodiment. A first substrate 83 illustrated in FIG. 19 is formed with a recess 832 for forming a coat that covers the proximity of two adjacent fourth openings 831. A first substrate 84 illustrated in FIG. 20 is formed with a recess 842 for forming a coat that covers the proximity of three adjacent fourth openings 841. A first substrate 85 illustrated in FIG. 21 is formed with a recess 852 for forming a coat that covers the proximity of two adjacent fourth openings 851. As in the second embodiment, each of these coats, made of the insulating material filled in these recesses 832, 842, and 852, also functions as a rotation preventer.

With conventional technologies, when the conductive contacts are narrowly spaced, it has been difficult to form the insulating material having the shapes as illustrated in FIGS. 19 to 21 beforehand, and then to insert the insulating material into the openings provided in the holder substrate. To solve this problem, a substitute made of a combination of rod-like circular members may be used. However, with the rod-like members, when matching the intrinsic impedance with that of the circuit board 2, or matching a pitch of conductive contacts to that of the electrodes on the semiconductor integrated circuit 100, the positional relationship of the insulating material, filling the space between the hole and the rod-like members, is limited. Consequently, a desired positional relationship may not be achieved.

On the other hand, according to the second embodiment, the recess can be formed more freely, as is obvious from FIGS. 19 to 21. In the structures illustrated in FIGS. 19 and 20, the pitch of the fourth openings may be made smaller than that usually expected. In this manner, according to the second embodiment, the limitation on mechanical processing provided to the conductive material making up the holder substrate, or the insulating material making up the holding member is extremely small compared with those in the known art, and the conductive contact holder can be designed more freely. Furthermore, the insulating material does not need to be machined independently, and no mould cost is required for casting, for example. Therefore, according to the second embodiment, desired electrical characteristics can be easily predetermined to a conductive contact holder.

Third Embodiment

Figure 22:
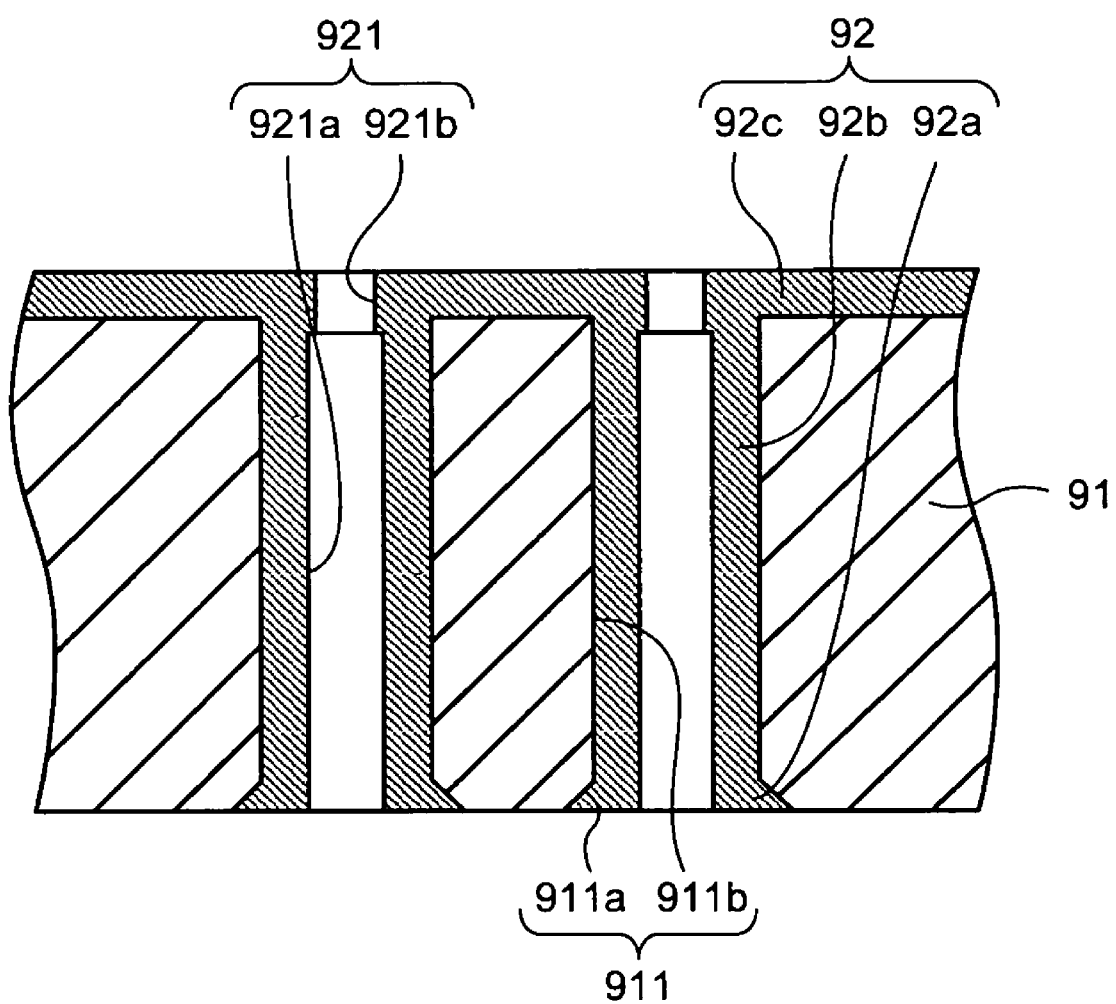
FIG. 22 is a diagram of a structure of relevant part of a first substrate of a conductive contact holder according to a third embodiment of the present invention.

FIG. 22 is a diagram of relevant part of a first substrate included in a conductive contact holder according to a third embodiment of the present invention. A first substrate 91 illustrated in FIG. 22 includes a fourth opening 911 for holding the signaling conductive contact 4a or the power-supplying conductive contact 4c. The fourth opening 911 includes a tapered portion 911a provided at one end of the first substrate 91 and having a diameter that is largest on the surface of the first substrate 91 and becoming smaller along the thickness direction thereof, and a small-diameter portion 911b having the same diameter as the smallest diameter of the tapered portion 911a.

A first holding member 92, placed in the fourth opening 911, includes a tapered portion 92a made of the insulating material tightly filled in the tapered portion 911a of the first substrate 91, a cylinder 92b made of the insulating material tightly filled in the small-diameter portion 911b, and a coat 92c covering the surface of the first substrate 91 with the same insulating material as, for example, the tapered portion 92a, the surface being the surface that the tapered portion 92a faces of the surfaces of the first substrate 91. The coat 92c is preferably approximately 20 to 50 micrometers in thickness. This coat 92c is also formed in proximity of the opening of the fifth opening (not illustrated) for holding the grounding conductive contact 4b. Therefore, it is preferable to form the coat 92c before forming the fifth opening, to prevent the insulating material from entering the fifth opening.

A hole 921 formed in the first holding member 92 has a shape of a stepped hole including a large-diameter hole 921a and a small-diameter hole 921b. Both of the large-diameter hole 821a and the small-diameter hole 821b have a cross section that is circular in shape.

The tapered portion 92a functions as a disengagement preventer that prevents the first holding member 92 from being disengaged in the direction of the normal line of the surface having the coat 92c while the hole 921 is formed. The coat 92c also functions as a rotation preventer that prevents rotation around the axis perpendicular to the surface of the first substrate 91 while the hole 921 is formed.

When the first holding member 92 is formed, the insulating material is filled in the fourth opening 911. At the same time, the surface of the first substrate 91, formed with a coat 93c, is covered with the same insulating material. During this filling process, the covering insulating material does not have to be uniform in thickness; however, the thickness of the covered surface must be greater than at least that of the coat 92c. In addition, the insulating material is filled so that the insulating material rises from the surface of the first substrate 91 at the end on the side of the tapered portion 911a.

The surfaces are then machined. The surface machining is performed to form the coat 92c on one side, and to make the surface of the first substrate 91 and that of the insulating material coplanar on the other side.

The large-diameter hole 921a and the small-diameter hole 921b are then processed successively to obtain the hole 921.

Figure 23:
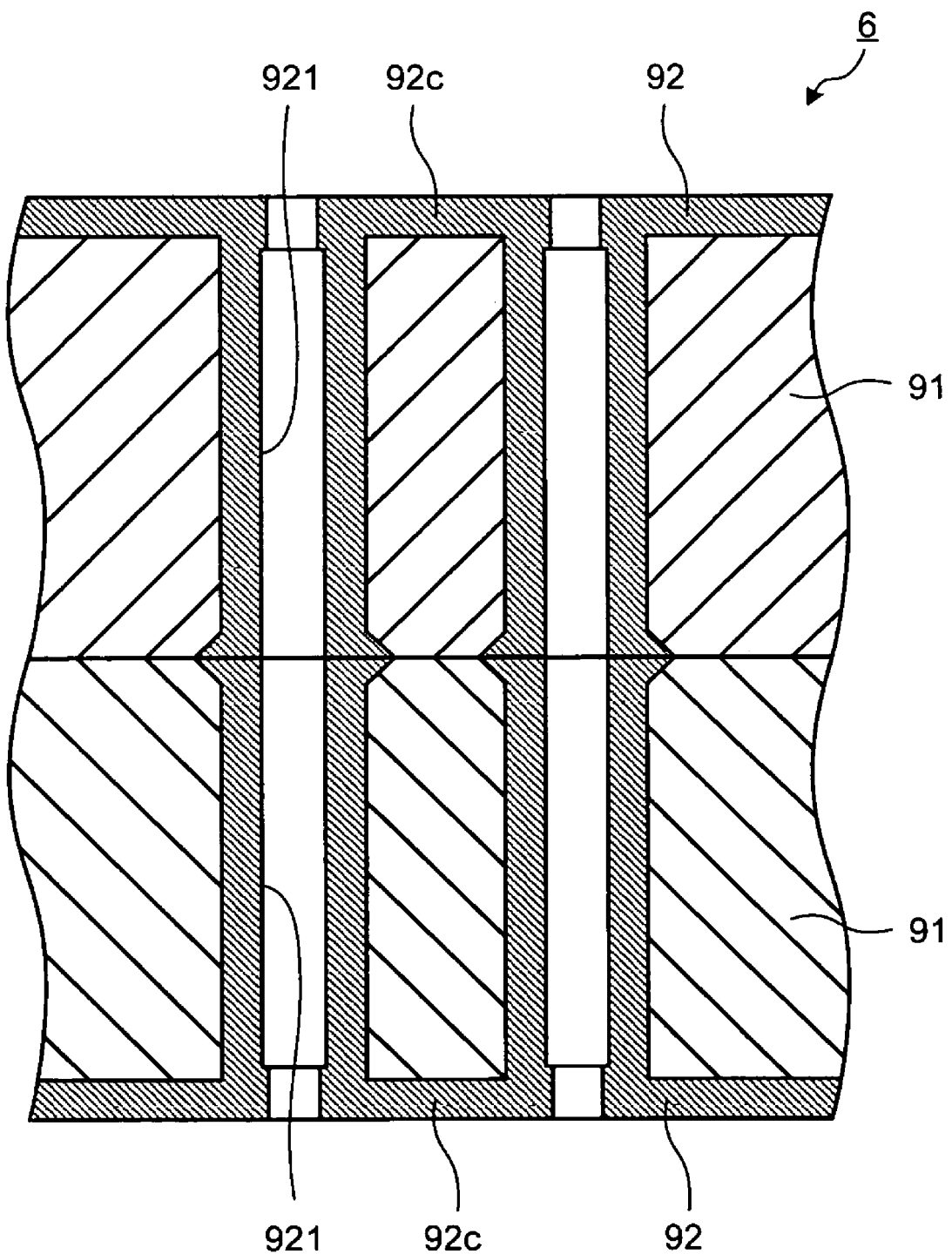
FIG. 23 is a diagram of a structure of relevant part of the conductive contact holder according to the third embodiment.

FIG. 23 is a diagram of structures of relevant part of a conductive contact holder according to the third embodiment. A conductive contact holder 6 illustrated in FIG. 23 is formed with the two first substrates 91, positioned up side down with respect to each other, stacked one upon the other. Thus, the second substrate has the same structure as that of the first substrate 91 in the conductive contact holder 6. It should be noted that the thickness of the second substrate may be different from that of the first substrate.

As just described, according to the third embodiment, the insulating coat 92c is provided on the surface of the holder substrate. Therefore, the electrodes, such as the signaling electrode 2a on the circuit board 2 or the connecting electrode 101 on the semiconductor integrated circuit 100, are reliably insulated from the surface of the holder substrate. Therefore, short circuiting due to the surface of the holder substrate being in contacting with any one of these electrodes is prevented.

The structures of the conductive contact holder and the conductive contact unit, not described above, are same as those of the conductive contact holder 3 and the conductive contact unit 1 according to the first embodiment.

As described above, according to the third embodiment, the holding member is formed by filling the openings (the first and the third openings), provided in the holder substrate, with the insulating material, machining the surface to make the insulating material and the surface of the holder substrate coplanar on one side of the holder substrate, machining the surface of the insulating material covering the entire surface on the other side of the holder substrate, and then forming the holes for inserting the conductive contacts. Therefore, it is possible to easily assemble the holding member that can hold the narrow-pitched conductive contacts with a small diameter to the holder substrate. Thus, it is possible to provide an easily manufactured conductive contact holder and a conductive contact unit capable of supporting a high frequency signal and a highly integrated and downsized inspection object, and a method of manufacturing such a conductive contact holder.

Furthermore, according to the third embodiment, the holding member includes the tapered portion that functions as a disengagement preventer for preventing the fluorine resin from being disengaged in the direction of the normal line of one of the surfaces of the holder substrate, and a coat that functions as a rotation preventer for preventing the fluorine resin from rotating around an axis perpendicular to the surface of the holder substrate. Therefore, there is no possibility for the insulating material to peel off from the holder substrate during the hole machining. As a result, adhesive needs not to be applied between the insulating material making up the holding member and the holder substrate. Thus, processes that are difficult to be performed in an extremely small area are omitted. Accordingly, manufacturing of the conductive contact holder becomes easier.

Furthermore, according to the third embodiment, the insulating material fills a predetermined opening, and at the same time, covers the surface of the holder substrate. Thus, the insulating member (the cylinder and the tapered portion), having a hole for inserting the conductive contact, and the coat, covering one of the surfaces of the holder substrate, can be formed simultaneously. Therefore, unlike with a conventional technology, difficult processes, such as inserting a pipe member or rod-like member to a thin hole, no longer need to be performed.

It should be noted that, also according to the third embodiment, a flange may be provided to the first holding member and the like as a disengagement preventer instead of the tapered portion as in the first holding member 36 explained in the first embodiment.

Modification of Third Embodiment

Figure 24:
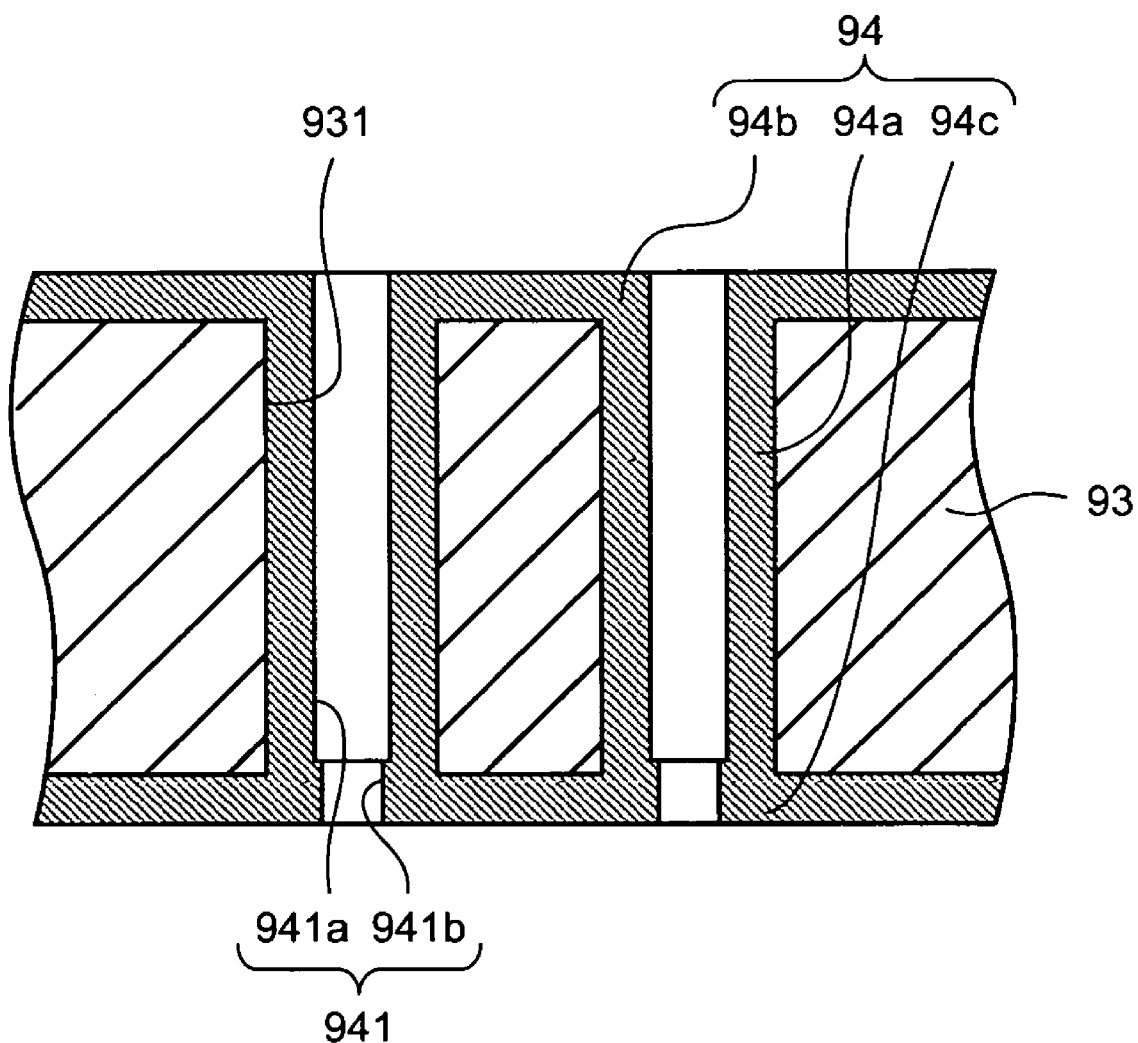
FIG. 24 is a diagram of a structure of relevant part of a conductive contact holder according to a modification of the third embodiment.

FIG. 24 is a diagram of structures of relevant part of a first substrate according one modification of the third embodiment. A first substrate 93, illustrated in FIG. 24, includes a fourth opening 931 having a uniform diameter, in the same manner as that in the first substrate 70 illustrated in FIG. 16.

A first holding member 94 has a hole for inserting the signaling conductive contact 4a or the power-supplying conductive contact 4c with respect to the insulating material filled in the fourth opening 931. The first holding member 94 includes a cylinder 94a tightly filled in the fourth opening 931, and coats 94b and 94c, each covering each surface of the first substrate 93. The coats 94b and 94c preferably have a thickness of approximately 20 to 50 micrometers. Moreover, according to this modification, it is preferable to form the coats 94b and 94c before forming the fifth opening for inserting the grounding conductive contact 4b.

A hole 941 formed in the first holding member 94 has a shape of a stepped hole including a large-diameter hole 941a and a small-diameter hole 941b. Both of the large-diameter hole 941a and the small-diameter hole 941b have a cross section that is circular in shape.

The first substrate 93 having such a structure can prevent rotation and disengagement of the insulating material during the hole machining, because the insulating material covers both surfaces of the holder substrate. In other words, each of the coats 94b and 94c functions as a disengagement preventer and a rotation preventer.

It should be noted that that this modification can be applied only when the holder substrate is formed in singularity.

Other Embodiments

The first to the third embodiments have been described as the best mode for carrying out the present invention. However, the scope of the present invention should not be limited by these embodiments. Moreover, in the description above, the present invention is assumed to be used for a semiconductor integrated circuit; however, the present invention may also be applied to an apparatus for detecting the characteristics of a liquid crystal panel, for example.

Furthermore, the structures of the conductive contacts should not be limited to those described above, and it is also possible to use conductive contacts having other structures.

No reference is made herein with regard to a transmission method of the input and output signals; however, when the conductive contact unit is used for high-frequency transmission, the conductive contact unit can be applied to any one of single-ended transmission and differential transmission. In other words, the conductive contact unit according to the present invention can be applied regardless of a type of the transmission method.

As described above, the present invention may include various embodiments that are not described herein and various design modifications are still possible within the scope of the present invention, without deviating from the technical concepts specified by the appended claims.

INDUSTRIAL APPLICABILITY

As described above, the conductive contact holder, the conductive contact unit, and the method of manufacturing the conductive contact holder according to the present invention are useful for testing electrical characteristics of, for example, a semiconductor integrated circuit.

The invention claimed is:

1. A conductive contact holder that holds a circuit structure to be inspected and a conductive contact for inputting and outputting a signal to and from a circuit board or supplying power to the circuit board, the circuit board generating a signal to be supplied to the circuit structure, the conductive contact holder comprising:
   a first substrate that includes a plurality of openings each holding the conductive contact;
   a first holding member that is formed by filling the openings with an insulating material that forms a coat covering part or all of a surface of the first substrate and smoothing a surface of the insulating material except part of the coat, and that includes a plurality of holes located at positions corresponding to the openings, respectively, the conductive contact being inserted through each of the holes;
   a second substrate that is conductive and is substantially identical in shape with the first substrate, the second substrate being layered on the first substrate; and
   a second holding member that is substantially identical in shape with the first holding member, and includes a plurality of holes each communicating with one of the holes of the first holding member, wherein
   the coat of the first holding member and a coat of the second holding member are located on opposite surfaces with the first substrate and the second substrate therebetween.

2. The conductive contact holder according to claim 1, wherein
   the first substrate includes a concave portion that is filled with the insulating material to form the coat, the concave portion having a predetermined depth from the surface, and
   part of the openings have an end at a bottom of the concave portion.

3. The conductive contact holder according to claim 1, wherein the openings of the first substrate each include
   a tapered portion that has a largest diameter on a side of a surface facing the second substrate, and gradually tapers along a thickness direction of the first substrate, and
   a cylindrical small diameter portion that has a diameter equal to a smallest diameter of the tapered portion, and communicates with the tapered portion.

4. The conductive contact holder according to claim 1, wherein the insulating material is fluorine resin.

5. A conductive contact unit comprising;
   a conductive contact holder;
   a plurality of conductive contacts that are held in the conductive contact holder; and
   a circuit board, wherein
   the conductive contact holder holds a circuit structure to be inspected and the conductive contacts for inputting and outputting a signal to and from the circuit board or supplying power to the circuit board,
   the circuit board generates a signal to be supplied to the circuit structure,
   the conductive contact holder includes
      a first substrate that includes a plurality of openings each holding one of the conductive contacts,
      a first holding member that is formed by filling the openings with an insulating material that forms a coat covering part or all of a surface of the first substrate and smoothing a surface of the insulating material except part of the coat, and that includes a plurality of holes located at positions corresponding to the openings, respectively, the conductive contacts being inserted through the holes, respectively;

a second substrate that is conductive and is substantially identical in shape with the first substrate, the second substrate being layered on the first substrate; and a second holding member that is substantially identical in shape with the first holding member, and includes a plurality of holes each communicating with one of the holes of the first holding member, and the coat of the first holding member and a coat of the second holding member are located on opposite surfaces with the first substrate and the second substrate therebetween.

* * * * *